United States Patent
Asayama et al.

(10) Patent No.: US 7,085,547 B2
(45) Date of Patent: Aug. 1, 2006

(54) MIXER CIRCUIT AND HIGH FREQUENCY SIGNAL RECEIVER USING THE SAME

(75) Inventors: Sanae Asayama, Aichi (JP); Atsuhito Terao, Gifu (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 416 days.

(21) Appl. No.: 10/721,670

(22) Filed: Nov. 25, 2003

(65) Prior Publication Data

US 2004/0142673 A1    Jul. 22, 2004

(30) Foreign Application Priority Data

Nov. 26, 2002  (JP) .............................. 2002-342004

(51) Int. Cl.
*H04B 1/10* (2006.01)
(52) U.S. Cl. ..................... 455/302; 455/304; 455/296
(58) Field of Classification Search ................ 455/302, 455/296, 303, 304, 305, 306
See application file for complete search history.

(56) References Cited

U.S. PATENT DOCUMENTS

| | | | | |
|---|---|---|---|---|
| 3,991,419 A | * | 11/1976 | Thomas | 455/306 |
| 4,403,351 A | * | 9/1983 | Karabinis | 455/304 |
| 4,715,047 A | * | 12/1987 | Hambley | 375/330 |
| 4,942,591 A | * | 7/1990 | Nease et al. | 375/330 |
| 5,095,536 A | * | 3/1992 | Loper | 455/324 |
| 5,179,730 A | * | 1/1993 | Loper | 455/266 |
| 5,412,690 A | * | 5/1995 | Kotzin et al. | 375/256 |
| 5,483,695 A | | 1/1996 | Pardoen | |
| 5,708,383 A | | 1/1998 | Lee | |
| 6,075,980 A | * | 6/2000 | Scheck | 455/324 |
| 6,194,947 B1 | | 2/2001 | Lee et al. | |
| 6,335,952 B1 | | 1/2002 | Lee et al. | |
| 6,385,442 B1 | * | 5/2002 | Vu et al. | 455/318 |
| 6,486,824 B1 | * | 11/2002 | Shupe | 342/16 |
| 6,584,304 B1 | * | 6/2003 | Norholm et al. | 455/188.1 |
| 6,636,730 B1 | * | 10/2003 | Spargo et al. | 455/302 |
| 6,671,332 B1 | * | 12/2003 | Haubrich | 375/334 |
| 6,735,426 B1 | * | 5/2004 | Pau | 455/255 |
| 6,819,911 B1 | * | 11/2004 | Clelland et al. | 455/296 |

FOREIGN PATENT DOCUMENTS

JP    52-132710    11/1977

OTHER PUBLICATIONS

European Search Report corresponding to application No. EP 03 02 7064 dated Mar. 10, 2004.
Behzad Razavi, "RF Microelectronics," Chap. 5, Transceiver Architecture, Section 5.2.3, Image-Reject Receivers, 1998, pp. 138-146.

* cited by examiner

*Primary Examiner*—Quochien B. Vuong
*Assistant Examiner*—Christian A. Hannon
(74) *Attorney, Agent, or Firm*—RatnerPrestia

(57) ABSTRACT

A mixer circuit can suppress image interfering signals and interfering signals related to higher harmonic component of an oscillator. Using the mixer circuit, it is possible to provide a high-frequency signal receiver which maintains good signal receiving condition. This mixer circuit comprises a plurality of mixers, oscillators, a plurality of oscillator phase shifters which serve to phase-shift the output of the oscillators and supply the output to the mixers, and a plurality of intermediate frequency phase shifters which serve to phase-shift the output of the mixers. The high-frequency signal receiver comprises at least a pre-filter and the mixer circuit.

18 Claims, 17 Drawing Sheets

MIXER CIRCUIT AND HIGH FREQUENCY SIGNAL RECEIVER USING THE SAME

FIELD OF THE INVENTION

The present invention relates to a mixer circuit used for receiving high-frequency signal such as broadcasting signal and communication signal, and a high-frequency signal receiver using the mixer circuit.

BACKGROUND OF THE INVENTION

A conventional mixer circuit (hereinafter referred to as image rejection mixer or IRM) for suppressing image interference is described.

FIG. 16 shows a conventional IRM. As shown in FIG. 16, the conventional IRM comprises input terminal 1101 to which high-frequency signal is inputted; mixer 1103 of which the high-frequency signal inputted to the input terminal 1101 is supplied to one input and the output signal of oscillator 1102 is supplied to the other input; output terminal 1107 to which the output from the mixer 1103 is supplied; mixer 1105 of which the high-frequency signal inputted to the input terminal 1101 is supplied to one input; oscillator phase shifter 1104 which is connected between the other input of the mixer 1105 and the output of the oscillator 1102 and also serves to shift the phase of the other input of the mixer 1103 by $-\pi/2$ radian; intermediate frequency phase sifter 1106 which is connected between the output of the mixer 1105 and the output terminal 1107 and serves to shift the output of the mixer 1105 by $-3\pi/2$ radian in phase.

The operation of the mixer circuit configured as described above is set so that the phase difference at the output of the mixer 1105 becomes $-\pi/2$ radian as against the phase at the output of the mixer 1103. Further, since the intermediate frequency phase shifter 1106 with phase shift of $-3\pi/2$ raidan is inserted in the output of the mixer 1105, it is possible to allow the desired signal pass and to cancel the image interfering signal.

The detailed description is given in the following. Here, all of the amplitudes of the input signal, fundamental output signal of oscillator 1102, and tertiary higher harmonic components generated by limiter circuits in the mixer 1103 and 1105 receiving the fundamental output component from the oscillator 1102 are 1. Also, all of the gain of mixer 1103 and 1105, the gain of oscillator phase shifter 1104, and the gain of intermediate frequency phase shifter 1106 are 1, simplifying the following description.

The reason for simplifying the description is such that the phase is a problem of greater concern rather than the amplitude because signals from the output terminal 1107 are outputted with two signals added or suppressed.

Specifically, the amplitude is 1 with respect to each of desired signal Vd being the input signal, image interfering signal Vi, interfering signal (hereafter Vm1) being at a lower side apart by IF (frequency of intermediate frequency signal) as against a frequency three times higher than the fundamental frequency from the oscillator 1102, and interfering signal (hereafter Vm2) being at an upper side apart by IF as against a frequency three times higher than the fundamental frequency from the oscillator 1102.

Also, the amplitude of fundamental output component VL of the oscillator 1102 is 1. The amplitude is 1 with respect to each of tertiary higher harmonic component VL3a generated by the limiter circuit in the mixer 1103 receiving the fundamental component VL from the oscillator 1102 and tertiary higher harmonic component VL3b generated by the limiter circuit in the mixer 1105 receiving the fundamental output component from the oscillator 1102 via the oscillator phase shifter 1104. The tertiary higher harmonic component VL3a and tertiary higher harmonic component VL3b are actually lower in amplitude as against the fundamental output component VL of the oscillator 1102, but the amplitude is to be 1 for simplifying the description.

Firstly, the description will be given by using calculating expressions with respect to a case such that desired signal Vd and image interfering signal Vi are inputted to the input terminal 1101.

Desired signal Vd is represented by formula 1. Here, angular frequency is $\omega_1$, time is t, and phase angle is $-\theta_1$.

$$Vd = \sin(\omega_1 t - \theta_1) \quad \text{(formula 1)}$$

Also, image interfering signal Vi is represented by formula 2. Here, angular frequency is $\omega_3$, and phase angle is $-\theta_3$.

$$Vi = \sin(\omega_3 t - \theta_3) \quad \text{(formula 2)}$$

Further, fundamental output component VL of the oscillator 1102 is represented by formula 3. Here, angular frequency is $\omega_2$, and phase angle is $-\theta_2$.

$$VL = \sin(\omega_2 t - \theta_2) \quad \text{(formula 3)}$$

The desired signal Vd and image interfering signal Vi are respectively divided into two signals to be inputted to one input 1103a of the mixer 1103, and in case the fundamental output component VL of the oscillator 1102 is inputted to the other terminal 103b of the mixer 1103, signal V (1103c) outputted from the output 1103c of the mixer 1103 is a signal represented by formula 4.

$$V(1103c) = 1/2 \times (Vd + Vi) \times VL \quad \text{(formula 4)}$$
$$= 1/2 \times (1/2 \times \cos(\omega_2 t - \omega_1 t + \theta_1 - \theta_2) +$$
$$1/2 \times \cos(\omega_3 t - \omega_2 t - \theta_3 + \theta_2))$$

Next, same signal as that of the mixer 1103 is inputted to one input 1105a of the mixer 1105. A signal of which the phase of oscillator 1102 is shifted by $-\pi/2$ radian by the oscillator phase shifter 1104 is inputted to the other input 1105b of the mixer 1105. Accordingly, signal V (1105c) that is IF signal component (intermediate frequency component) from output 1105c of the mixer 1105 can be represented by formula 5.

$$V(1105c) = 1/2 \times (Vd + Vi) \times \sin(\omega_2 t - \theta_2 - \pi/2) \quad \text{(formula 5)}$$
$$= 1/2 \times (1/2 \times$$
$$\cos(\omega_2 t - \omega_1 t + \theta_1 - \theta_2 - \pi/2) +$$
$$1/2 \times \cos(\omega_3 t - \omega_2 t - \theta_3 + \theta_2 + \pi/2))$$

Since the signal V (1105c) is phase-shifted by $-3\pi/2$ radian by the intermediate frequency phase shifter 1106, the signal V (1106a) of the output 1106a of the intermediate frequency phase shifter 1106 can be represented by formula 6.

$$V(1106a) = 1/2 \times (1/2 \times \cos(\omega_2 t - \omega_1 t + \theta_1 - \theta_2) \quad \text{(formula 6)}$$
$$= +1/2 \times \cos(\omega_3 t - \omega_2 t - \theta_3 + \theta_2 - \pi))$$

Also, since V (1103c) and V (1106a) are compounded at the output terminal 107, the IF signal component of V (1107) represented by formula 7 is outputted from the output terminal 1107.

$$V(1107) = V(1103c) + V(1106a) \quad \text{(formula 7)}$$
$$= 1/2 \times \cos(\omega_2 t - \omega_1 t + \theta_1 - \theta_2)$$

As is obvious in formula 7, the first term of V (1103c) and the first term of V (1106a) which are the IF components of desired signal Vd are compounded twofold because of being coincident in phase with each other. Consequently, the IF component of desired signal Vd shown in formula 7 is outputted from the output terminal 1107.

On the other hand, the second term of V (1103c) and the second term of V (1106a) which are the IF components of image interfering signal Vi are canceled because of being in π radian relation in phase with each other. Consequently, the IF component of image interfering signal Vi is not outputted from the output terminal 1107.

FIG. 17 is a chart showing the phases of the desired signal and image interfering signal in the above conventional mixer circuit.

FIG. 17 shows the phases with respect to the desired signal and image interfering signal in the mixer 1103 and the mixer 1105, and their amplitudes are not represented. Further, the desired signal is shown by solid lines, and the image interfering signal is shown by dotted lines.

Also, for simplifying the description, all of the respective phases $-\theta_2$, $-\theta_1$ and $-\theta_3$ of the fundamental output component of the oscillator 1102, the desired signal and the image signal supplied from the input terminal 1101 are 0 radian in the following description.

Firstly, the desired signal Vd inputted to one input 1103a of the mixer 1103 is signal 1131, and the image interfering signal Vi is signal 1132, and the phases of both signals are 0 radian in the representation. Next, signal 1133 inputted to the other input 1103b of the mixer 1103 can be same in phase in the representation. Further, from the formula 4, the desired signal 1134 outputted as IF signal component from the output 1103c of the mixer 1103 becomes 0 radian in phase, and the image interfering signal 1135 outputted as IF signal component also becomes 0 radian in phase.

Secondly, the desired signal Vd to one input 1105a of the mixer 1105 is signal 1136, and the image interfering signal Vi is signal 1137, same as the signal 1131 of desired signal Vd inputted to the mixer 1103 and the signal 1132 of image interfering signal Vi. Next, since the signal 1138 is inputted to the other input 1105b of the mixer 1105 via the oscillator phase shifter 1104, it is represented as a signal phase-shifted by $-\pi/2$ radian as against the output signal of oscillator 1102.

As shown in the formula 5, the desired signal 1139 outputted as IF signal component from the output 1105c of the mixer 1105 is phase-shifted by $-\pi/2$ radian. Also, the image interfering signal 1140 outputted as IF signal component from the output 1105c of the mixer 1105 is phase-shifted by $\pi/2$ radian. Further, since the output 1106a is phase-shifted by $-3\pi/2$ radian by the intermediate frequency phase shifter 1106, the desired signal 1141 and the image interfering signal 1142 can be represented as shown in FIG. 17.

Finally, the desired signal outputted as IF signal component from the output terminal 1107 is a composite signal of the desired signal 1134 outputted from the mixer 1103 and the desired signal 1141 outputted from the mixer 1105. These desired signals 1134 and 1141 being coincident in phase with each other are doubled to become the desired signal 1143. Also, the image interfering signal outputted as IF signal component from the output terminal 1107 is a composite signal of the image interfering signal 1135 outputted from the mixer 1103 and the image interfering signal 1142 outputted from the mixer 1105. In this case, the image interfering signals 1135 and 1142 are in π radian relation in phase difference and canceled to become 0. Accordingly, no image interfering signal is outputted. This coincides with the aforementioned formula 7.

As described above, the desired signal is allowed to pass, but the image interfering signal is canceled and not outputted.

A conventional mixer circuit that may prevent image interference is disclosed in Japanese Laid-open Patent S52-132710.

Also, a like circuit is mentioned in "RF MICROELECTRONICS" written by Behzad Razavi (University of California, Los Angeles), P138–P146, 1998.

However, in such conventional configuration, for example, when TV broadcasting signal of relatively low frequency channel is received, it is possible to suppress the image interfering signal. However, in case of interfering signal being at a lower or upper side apart by intermediate frequency (hereafter called IF) as against a frequency three times higher than the fundamental frequency from the oscillator 1102, it will cause the generation of spurious, and the signal reception is disturbed or it becomes unable to receive the signal.

The reasons for the above are mentioned in the following. Here, it is supposed that interfering signal being at a lower or upper side apart by IF as against a frequency three times higher than the fundamental frequency from the oscillator 1102 is inputted to the input terminal 1101, and the description will be given by using calculating expressions.

Interfering signal Vm1 being at a lower side apart by IF as against a frequency three times higher than the fundamental frequency from the oscillator 1102 is represented by formula 8. Here, the angular frequency is $\omega_4$, and the phase is $-\theta_4$.

$$Vm1 = \sin(\omega_4 t - \theta_4) \quad \text{(formula 8)}$$

Further, interfering signal Vm2 being at an upper side apart by IF as against a frequency three times higher than the fundamental frequency from the oscillator 1102 is represented by formula 9. Here, the angular frequency is $\omega_5$, and the phase is $-\theta_5$.

$$Vm2 = \sin(\omega_5 t - \theta_5) \quad \text{(formula 9)}$$

VL3a that is the tertiary higher harmonic component generated by a limiter circuit in the mixer 1103 receiving the fundamental output component from the oscillator 1102 can be represented by formula 10.

$$VL3a = \sin(3\omega_2 t - 3\theta_2) \quad \text{(formula 10)}$$

VL3b that is the tertiary higher harmonic component generated by a limiter circuit in the mixer 1105 receiving the fundamental output component from the oscillator 1102 via the oscillator phase shifter 1104 can be represented by formula 11.

$$VL3b = \sin(3\omega_2 t - 3\theta_2 - 3\pi/2) \quad \text{(formula 11)}$$

Interfering signals Vm1 and Vm2 are respectively divided into two signals and inputted to one terminal 1103a of the mixer 1103. The equivalent of this is that tertiary higher harmonic component VL3a is inputted to the other input 1103b of the mixer 1103. Therefore, V (1103c) outputted as IF component from the output 1103c of the mixer 1103 is a signal that can be represented by formula 12.

$$V(1103c) = 1/2 \times (Vm1 + Vm2) \times VL3a \quad \text{(formula 12)}$$
$$= 1/2 \times (1/2 \times$$
$$\cos(3\omega_2 t - \omega_4 t + \theta_4 + 3\theta_2) +$$
$$1/2 \times \cos(\omega_5 t - 3\omega_2 t + \theta_5 + 3\theta_2))$$

Next, same signal as that of the mixer 1103 is inputted to one input 1105a of the mixer 1105. The equivalent of this is that tertiary higher harmonic component VL3b is inputted to the other input 1105b of the mixer 1105. Therefore, V (1105c) outputted as IF component from the output 1105c of the mixer 1105 is a signal that can be represented by formula 13.

$$V(1105c) = 1/2 \times (Vm1 + Vm2) \times VL3b \quad \text{(formula 13)}$$
$$= 1/2 \times (1/2 \times \cos(3\omega_2 t - \omega_4 t + \theta_4 -$$
$$3\theta_2 - 3\pi/2) + 1/2 \times \cos(\omega_5 t - 3\omega_2 t -$$
$$\theta_5 + 3\theta_2 + 3\pi/2))$$

Since the V (1105c) is phase-shifted by $-3\pi/2$ radian by the oscillator phase shifter 1106, V (1106a) that is the output 1106a of the oscillator phase shifter 1106 can be represented by formula 14.

$$V(1106a) = \tfrac{1}{2} \times (\tfrac{1}{2} \times \cos(3\omega_2 t - \omega_4 t + \theta_4 - 3\theta_2 - \pi) + \tfrac{1}{2} \times \cos(\omega_5 t - 3\omega_2 t - \theta_5 + 3\theta_2)) \quad \text{(formula 14)}$$

Also, V (1107) outputted from the output terminal 1107 is a composite signal of V (1103c) and V (1106a), and can be represented by formula 15.

$$V(1107) = V(1103c) + (V1106a) \quad \text{(formula 15)}$$
$$= 1/2 \times \cos(\omega_5 t - 3\omega_2 t - \theta_5 + 3\theta_2))$$

As is obvious in formula 15, the first term of V (1103c) and the first term of V (1106a) which are the IF components of interfering signal Vm1 are in π radian relation in phase with each other and canceled. Consequently, the IF component of interfering signal Vm1 is not outputted from the output terminal 1107.

On the other hand, the second term of V (1103c) and the second term of V (1106a) which are the IF components of interfering signal Vm2 are coincident in phase with each other and compounded twofold to be outputted from the output terminal 1107. That is, interfering signal Vm2 being at an upper side apart by IF as against a frequency three times the fundamental frequency from the mixer 1102 is outputted as an interfering signal.

FIG. 18 is a diagram showing the phases of interfering signals related to a frequency three times higher than the fundamental frequency from the oscillator in a conventional mixer circuit.

FIG. 18 shows the phases of interfering signals being at a lower or upper side apart by IF as against a frequency three times higher than the fundamental frequency from the oscillator 1102 at each portion of the mixer 1103 and mixer 1105, and includes no representation about the amplitudes.

In this case, interfering signal Vm1 is shown by solid lines, and interfering signal Vm2 is shown by dotted lines.

Firstly, interfering signals Vm1 and Vm2 are signal 1171 and signal 1172 respectively. The signal 1171, interfering signal Vm1, and the signal 1172, interfering signal Vm2, are inputted to one terminal 1103a of the mixer 1103. Also, tertiary higher harmonic component VL3a generated in the mixer 1103 can be represented by signal 1173 from the formula 10. Further, the IF components of interfering signals Vm1 and Vm2 outputted from the output 1103c of the mixer 1103, as is obvious in the formula 12, can be represented by signal 1174 and signal 1175 respectively.

Next, the interfering signals Vm1 and Vm2 inputted to one input 1105a of the mixer 1105 are represented by signal 1176 and signal 1177 respectively. Here, the signal 1176 is inputted as same signal as signal 1171, and the signal 1177 is inputted as same signal as signal 1172.

Also, the fundamental output component of the oscillator 1102 is phase-shifted by $-\pi/2$ radian by the oscillator phase shifter 1104 before being inputted to the other input of the mixer 1105. Accordingly, VL3b that is the tertiary higher harmonic component generated by the limiter circuit in the mixer 1105 can be represented by signal 1178 from the formula 11. Further, the IF components of interfering signals Vm1 and Vm2 outputted from the output 1105c of the mixer 1105 can be respectively represented by signal 1179 and signal 1180 from the formula 13.

Next, the IF components of interfering signals Vm1 and Vm2 from the output 1105c are phase-shifted by $-3\pi/2$ radian at the oscillator phase shifter 1106. Accordingly, at the output 1106a, the components become signal 1181 and signal 1182 respectively from the formula 14.

Thus, the IF component of interfering signal Vm1 outputted from the output terminal 1107 is a composite signal of signal 1174 and signal 1181. Since the signal 1174 and signal 1181 are in π radian relation in phase with each other, the interfering signal Vm1 is canceled and not outputted.

On the other hand, the IF component of interfering signal Vm2 outputted from the output terminal 1107 is a composite signal of signal 1175 and signal 1182. In this case, however, since the signals 1175 and 1182 are coincident in phase with each other, the signals are added to become signal 1183 and outputted. This coincides with the calculation result of the formula 15.

The output signal from the oscillator 1102 is inputted to the other inputs of the mixer 1103 and 1105, but the input amplitude from the oscillator 1102 for enhancing the fundamental frequency performance of the mixer 1103 and 1105 is sufficiently raised by amplifiers in the mixer 1103 and 1105 before using. Or, the input signal from the oscillator 1102 is changed to a rectangular wave signal by the limiter circuit. The rectangular wave signal is used for switching the received signal as the operation of a mixer.

Therefore, even when the higher harmonic component of the oscillator 1102 itself is of low amplitude, higher harmonic components are generated by the amplifiers or limiter circuits in the mixer 1103 and 1105 at the later stage. Incidentally, when the circuit is integrated, a circuit of differential type suited for integration is employed, and then, the higher harmonic component of even multiple is of relatively low amplitude, but the higher harmonic component of odd multiple becomes higher.

Also, since the amplitude of tertiary higher harmonic component or quinary higher harmonic component close to the fundamental output component of the oscillator 1102 is relatively high, if there exists an interfering signal in a frequency being at an upper side or lower side apart by IF as against the higher harmonic component, the signal reception is affected and it becomes unable to receive the signal because of interference.

Table 1 shows whether interfering signals related to higher harmonic components generated by the fundamental output component of the oscillator 1102 can be prevented or not at a conventional IRM.

TABLE 1

|  | As against n times × (fundamental) − IF | | As against n times × (fundamental) + IF | |
| --- | --- | --- | --- | --- |
|  | Input frequency | Effects | Input frequency | Effects |
| n = 1 | Fundamental frequency − IF | Desired signal | Image interference | o |
| n = 3 | 3 times × fundamental frequency − IF | o | 3 times × fundamental frequency + IF | x |
| n = 5 | 5 times × fundamental frequency − IF | x | 5 times × fundamental frequency + IF | o |
| n = 7 | 7 times × fundamental frequency − IF | o | 7 times × fundamental frequency + IF | x |
| n = 9 | 9 times × fundamental frequency − IF | x | 9 times × fundamental frequency + IF | o |
| n = 11 | 11 times × fundamental frequency − IF | o | 11 times × fundamental frequency + IF | x |
| n = 13 | 13 times × fundamental frequency − IF | x | 13 times × fundamental frequency + IF | o |
| . | . | . | . | . |
| . | . | . | . | . |
| . | . | . | . | . | o - effective to suppress, able to eliminate.
x - not effective to suppress, unable to eliminate.

In Table 1, when "n" representing the multiple of the fundamental frequency of oscillator 1102 is 1, it shows the fundamental frequency as the oscillator 1102, and (fundamental−IF) stands for desired signal, and (fundamental+IF) stands for image interfering signal. It shows that it is effective to suppress the image interfering signal.

Further, it shows that it is effective to suppress interfering signal Vm1 but not effective to suppress interfering signal Vm2 when "n" is 3. Also, it shows that it is hardly effective to suppress the interfering signal being either at a lower side or at an upper side apart by IF as against a frequency n times higher when "n" of the fundamental frequency from the oscillator 1102 is 5 or over.

Thus, in TV broadcasting signal, when a channel of relatively low frequency is received, there arises a problem that the signal reception is affected by interfering signal in case the broadcasting channel is at a frequency being at an upper side apart by IF as against a frequency three times higher than the fundamental frequency from the oscillator 1102 or at a frequency being at a lower side apart by IF as against a frequency five times higher.

SUMMARY OF THE INVENTION

A mixer circuit, comprising at least:
an oscillator;
a mixer of which a high-frequency signal is supplied to one input, and an output signal of the oscillator is supplied to the other input;

an oscillator phase shifter which is connected between the other input of the mixer and the output of the oscillator and serves to shift the phase of output signal of the oscillator; and an intermediate frequency phase shifter which is connected to the output of the mixer and serves to shift the phase of output of the mixer, wherein the other input of the mixer is provided with a limiter circuit.

A high-frequency signal receiver, comprising at least:
a pre-filter, and
the mixer circuit.

DETAILED DESCRIPTION OF THE EXEMPLARY EMBODIMENTS

The present invention is intended to solve the problem of prior art and to provide a mixer circuit (hereinafter referred to as HRM, abbreviation of harmonic rejection mixer) which may suppress image signal, interfering signal being at a lower side or upper side apart by IF (intermediate frequency) as against a frequency of higher harmonics of the fundamental frequency from a mixer.

The exemplary embodiments of the present invention will be described in the following with reference to the drawings.

Exemplary Embodiment 1

Figure 1:
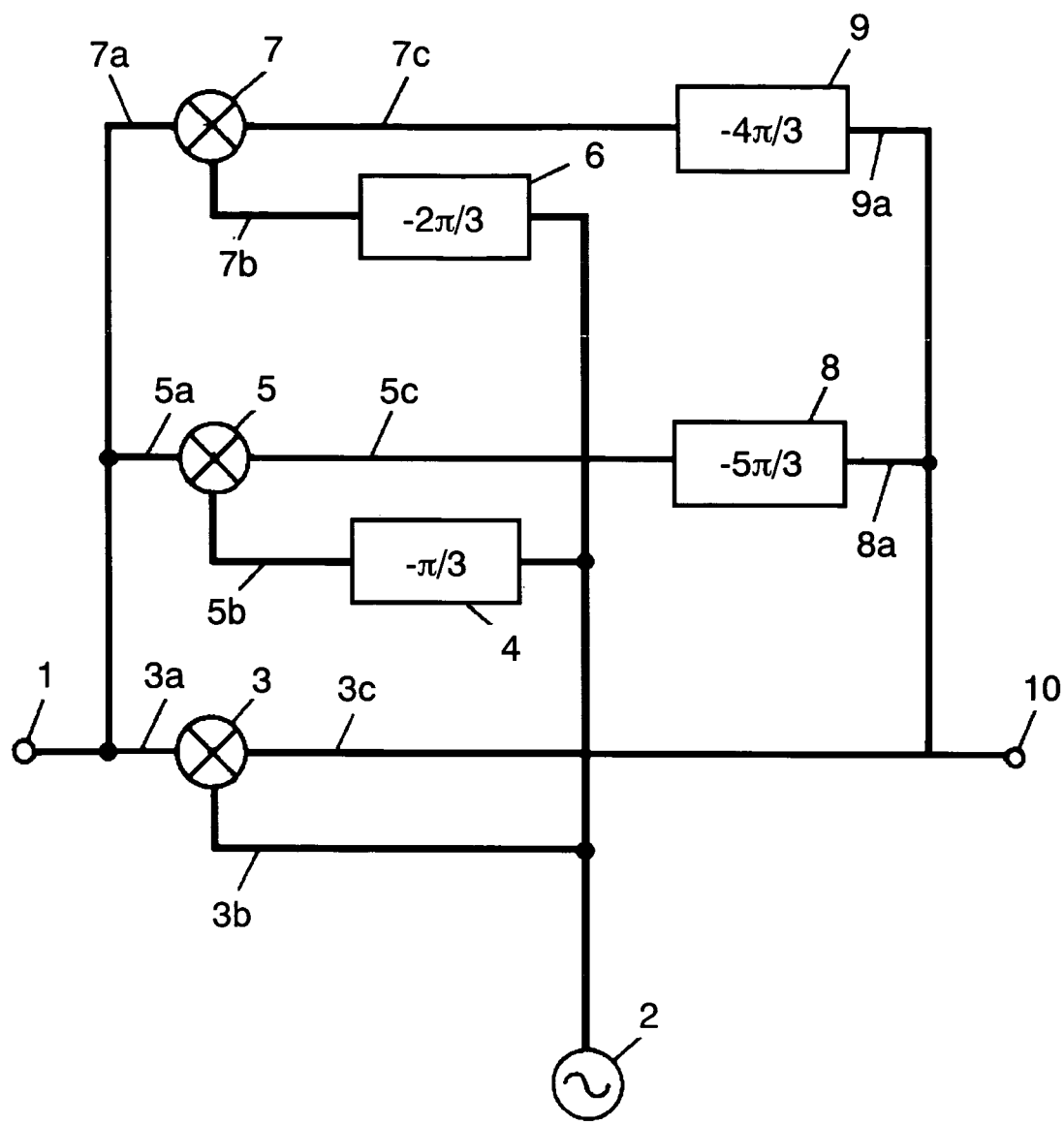
FIG. 1 is a block diagram of a mixer circuit in the exemplary embodiment 1 of the present invention.

FIG. 1 is a block diagram of a mixer circuit in the exemplary embodiment 1 of the present invention.

In FIG. 1, the mixer circuit of this exemplary embodiment comprises input terminal 1 to which high-frequency signal is inputted; first mixer 3 (hereafter called mixer 3) of which the high-frequency signal inputted to the input terminal 1 is connected to one of the inputs and the output signal of oscillator 2 is connected to the other input; output terminal 10 to which the output from the mixer 3 is connected; second mixer 5 (hereafter called mixer 5) of which the high-frequency signal inputted to the input terminal 1 is connected to one of the inputs; first oscillator phase shifter 4 (hereafter called oscillator phase shifter 4) which is connected between the other input of mixer 5 and the output of oscillator 2 and serves to shift the phase of the output signal of oscillator 2 by $-\pi/3$ radian as against the phase of the other input of mixer 3; first intermediate frequency phase shifter 8 (hereafter called intermediate frequency phase shifter 8) which is connected between the output of mixer 5 and the output terminal 10 and serves to shift the phase by $-5\pi/3$ radian as against the output of mixer 3; third mixer 7 (hereafter called mixer 7) of which the high-frequency signal inputted to the input terminal 1 is connected to one of the inputs; second oscillator phase shifter 6 (hereafter called oscillator phase shifter 6) which is connected between the other input of mixer 7 and the output of oscillator 2 and serves to shift the phase of the output signal of oscillator 2 by $-2\pi/3$ radian as against the phase of the other input of mixer 3; and second intermediate frequency phase shifter 9 (hereafter called intermediate frequency phase shifter 9) which is connected between the output of mixer 7 and the output terminal 10 and serves to shift the phase by $-4\pi/3$ radian as against the output of mixer 3.

The oscillator 2 is able to continuously vary the oscillation frequency nearly in a range from about 100 MHz to about 1000 MHz. Also, the other inputs of mixer 3, mixer 5 and mixer 7 are provided with an amplifier of high amplification degree or a limiter circuit. The purpose of this is to reliably mix the input signal from input terminal 1, output signal from mixer 2 in the form of rectangular waves.

The oscillator phase shifter 4 and oscillator phase shifter 6 serve to shift the phase of the output signal from the oscillator 2, and it is possible to use a highly accurate flip-flop system or to use a poly-phase system which can be inexpensively configured with only capacitors and resistors.

When the oscillation frequency varied by the oscillator 2 is of broad-band or when high accuracy is required for phase shift, a flip-flop system is often employed. However, when the oscillation frequency varied is of narrow-band or when high accuracy is not required for phase shift, an inexpensive poly-phase system is employed.

Further, the intermediate frequency phase shifter 8 and intermediate frequency phase shifter 9 serve to shift the phases of the outputs from the mixer 5 and the mixer 7 respectively. Here, phase-shifted is IF signal of predetermined signal frequency band from mixer 5 and mixer 7, and therefore, an inexpensive poly-phase system is often employed for the intermediate frequency phase shifter 8 and the intermediate frequency phase shifter 9. However, when high accuracy is required for phase shift, a flip-flop system is employed.

For example, it is possible to use a flip-flop system to configure the oscillator phase shifter 4 and oscillator phase shifter 6, and also to use poly-phase filters to configure the intermediate frequency phase shifter 8 and intermediate frequency phase shifter 9. In such configuration, even in case the frequency of mixer 2 is varied, the phase can be accurately shifted because the output signal is phase-shifted by the flip-flop system.

Also, the output from the mixer, being a single IF signal, is phase-shifted by a poly-phase filter that is an inexpensive part including only capacitor and resistor, and it is possible to cope with broad-band receive frequency width of high accuracy and to make the mixer excellent in cost performance as a whole.

Also, it is possible to use poly-phase filters to configure the oscillator phase shifter 4, oscillator phase shifter 6, and the intermediate frequency phase shifter 8, intermediate frequency phase shifter 9. In such configuration, the phase is shifted by a poly-phase filter that is an inexpensive part including only capacitor and resistor, and the cost reduction can be realized. Also, this is suited for a mixer circuit of which the receive frequency is of narrow-band.

Further, it is possible to use a flip-flop system to configure the oscillator phase shifter 4, oscillator phase shifter 6, and the intermediate frequency phase shifter 8, intermediate frequency phase shifter 9. Such a configuration is suited for a mixer circuit capable of coping with broad-band receive frequency width of higher accuracy.

The operation of a mixer circuit having a configuration as described above will be described in the following.

Here, all of the amplitudes of the input signal, fundamental output signal of oscillator 2, and tertiary higher harmonic components generated by the limiter circuits in the mixers 3, 5 and 7 receiving the fundamental output component from the oscillator 2 are 1. Also, all of the gain of mixers 3, 5, 7, the gain of oscillator phase shifters 4, 6, and the gain of intermediate frequency phase shifters 8, 9 are 1, simplifying the following description.

This is because the signal outputted from the output terminal 10 is outputted with three signals added or suppressed, and the phase becomes to be a problem that depends upon the amplitude.

Specifically, the amplitude is 1 with respect to each of desired signal Vd that is an input signal, image interfering signal Vi, interfering signal (hereafter called Vm1) being at a lower side apart by IF as against a frequency three times higher than the fundamental frequency from oscillator 2, and interfering signal (hereafter called Vm2) being at an upper side apart by IF as against a frequency three times higher than the fundamental frequency from oscillator 2.

Also, the amplitude of fundamental output component VL of the oscillator 2 is 1. The tertiary higher harmonic component VL3a generated by the limiter circuit in the mixer 3 receiving the fundamental component VL from the oscillator 2, tertiary higher harmonic component VL3b generated by the limiter circuit in the mixer 5 receiving the fundamental output component from the oscillator 2 via the oscillator phase shifter 4, and tertiary higher harmonic component VL3c generated by the limiter circuit in the mixer 7 receiving the fundamental output component from the oscillator 2 via the oscillator phase shifter 6 are actually lower in amplitude as against the fundamental output component VL of the oscillator 2, but the amplitude is to be 1 for simplifying the description.

Firstly, the description will be given by using calculating expressions with respect to a case such that desired signal Vd and image interfering signal Vi are inputted to the input terminal 1.

Desired signal Vd is represented by formula 16. Here, angular frequency is $\omega_1$, time is t, and phase angle is $-\theta_1$.

$$Vd = \sin(\omega_1 t - \theta_1) \quad \text{(formula 16)}$$

Also, image interfering signal Vi is represented by formula 17. Here, angular frequency is $\omega_3$, and phase angle is $-\theta_3$.

$$Vi = \sin(\omega_3 t - \theta_3) \quad \text{(formula 17)}$$

Further, fundamental output component VL of the oscillator 2 is represented by formula 18. Here, angular frequency is $\omega_2$, and phase angle is $-\theta_2$.

$$VL = \sin(\omega_2 t - \theta_2) \quad \text{(formula 18)}$$

The desired signal Vd and image interfering signal Vi are respectively divided into three signals to be inputted to one input 3a of the mixer 3, and the fundamental output component VL of the oscillator 2 is inputted to the other input 3b of the mixer 3, and signal V (3c) outputted from the output 3c of the mixer 3 can be represented by formula 19.

$$V(3c) = 1/3 \times (Vd + Vi) \times VL \quad \text{(formula 19)}$$
$$= 1/3 \times (1/2 \times \cos(\omega_2 t - \omega_1 t + \theta_1 - \theta_2) +$$
$$1/2 \times \cos(\omega_3 t - \omega_2 t - \theta_3 + \theta_2))$$

Next, same signal as that of the mixer 3 is inputted to one input 5a of the mixer 5, but a signal of which the phase of oscillator 2 is shifted by $-\pi/3$ radian by the oscillator phase shifter 4 is inputted to the other input 5b of the mixer 5. Accordingly, signal V (5c) being IF signal component from output 5c of the mixer 5 can be represented by formula 20.

$$V(5c) = 1/3 \times (Vd + Vi) \times \sin(\omega_1 t - \theta_1 - \pi/3) \quad \text{(formula 20)}$$
$$= 1/3 \times (1/2 \times$$
$$\cos(\omega_2 t - \omega_1 t + \theta_1 - \theta_2 - \pi/3) +$$
$$1/2 \times \cos(\omega_3 t - \omega_2 t - \theta_3 + \theta_2 + \pi/3))$$

Since the signal V (5c), output 5c of the mixer 5, is phase-shifted by $-5\pi/3$ radian by the intermediate frequency phase shifter 8, V (8a) that is IF component of output 8a of the intermediate frequency phase shifter 8 can be represented by formula 21.

$$V(8a) = 1/3 \times (1/2 \times \cos(\omega_2 t - \omega_1 t + \theta_1 - \theta_2) + 1/2 \times \cos(\omega_3 t - \omega_2 t - \theta_3 + \theta_2 - 4\pi/3)) \quad \text{(formula 21)}$$

Further, same signal as that of the mixer 3 is inputted to one input 7a of the mixer 7, but a signal of which the phase of oscillator 2 is shifted by $-2\pi/3$ radian by the oscillator phase shifter 6 is inputted to the other input 7b of the mixer 7. Accordingly, V (7c) that is IF component outputted from output 7c of the mixer 7 can be represented by formula 22.

$$V(7c) = 1/3 \times (Vd + Vi) \times \sin(\omega_2 t - \theta_2 - 2\pi/3) \quad \text{(formula 22)}$$
$$= 1/3 \times (1/2 \times$$
$$\cos(\omega_2 t - \omega_1 t + \theta_1 - \theta_2 - 2\pi/3) +$$
$$1/2 \times \cos(\omega_3 t - \omega_2 t - \theta_3 + \theta_2 + 2\pi/3))$$

Since V (7c), output 7c of the mixer 7, is phase-shifted by $-4\pi/3$ radian by the intermediate frequency phase shifter 9, signal V (9a) of the output 9a of the intermediate frequency phase shifter 9 can be represented by formula 23.

$$V(9a) = 1/3 \times (1/2 \times \cos(\omega_2 t - \omega_1 t + \theta_1 - \theta_2) + 1/2 \times \cos(\omega_3 t - \omega_2 t - \theta_3 + \theta_2 - 2\pi/3)) \quad \text{(formula 23)}$$

V (10) that is IF component outputted from output terminal 10 is a composite of three signals V (3c), V (8a) and V (9a), which can be represented by formula 24.

$$V(10) = V(3c) + V(8a) + V(9a) \quad \text{(formula 24)}$$
$$= 1/2 \times \cos(\omega_2 t - \omega_1 t + \theta_1 - \theta_2)$$

As is obvious in formula 24, the first term of V (3c), the first term of V (8a), and first term of V (9a) which are the IF components of desired signal Vd are compounded three-fold because of being coincident in phase with each other. Consequently, the IF component of desired signal Vd shown in formula 24 is outputted from the output terminal 10.

On the other hand, the second term of V (3c), the second term of V (8a), and the second term of V (9a) which are the IF components of image interfering signal Vi are canceled because of being in $2\pi/3$ radian relation in phase with each other. Consequently, the IF component of image interfering signal Vi is not outputted from the output terminal 10.

The changes of the signal phase will be described by using the drawings on the basis of the calculating expressions in the following. In this case, for simplifying the description, all of phases $\theta_2$, $\theta_1$, and $\theta_3$ of the fundamental output component of oscillator 2, desired signal, and image signal are 0 radian in the description.

Figure 2:
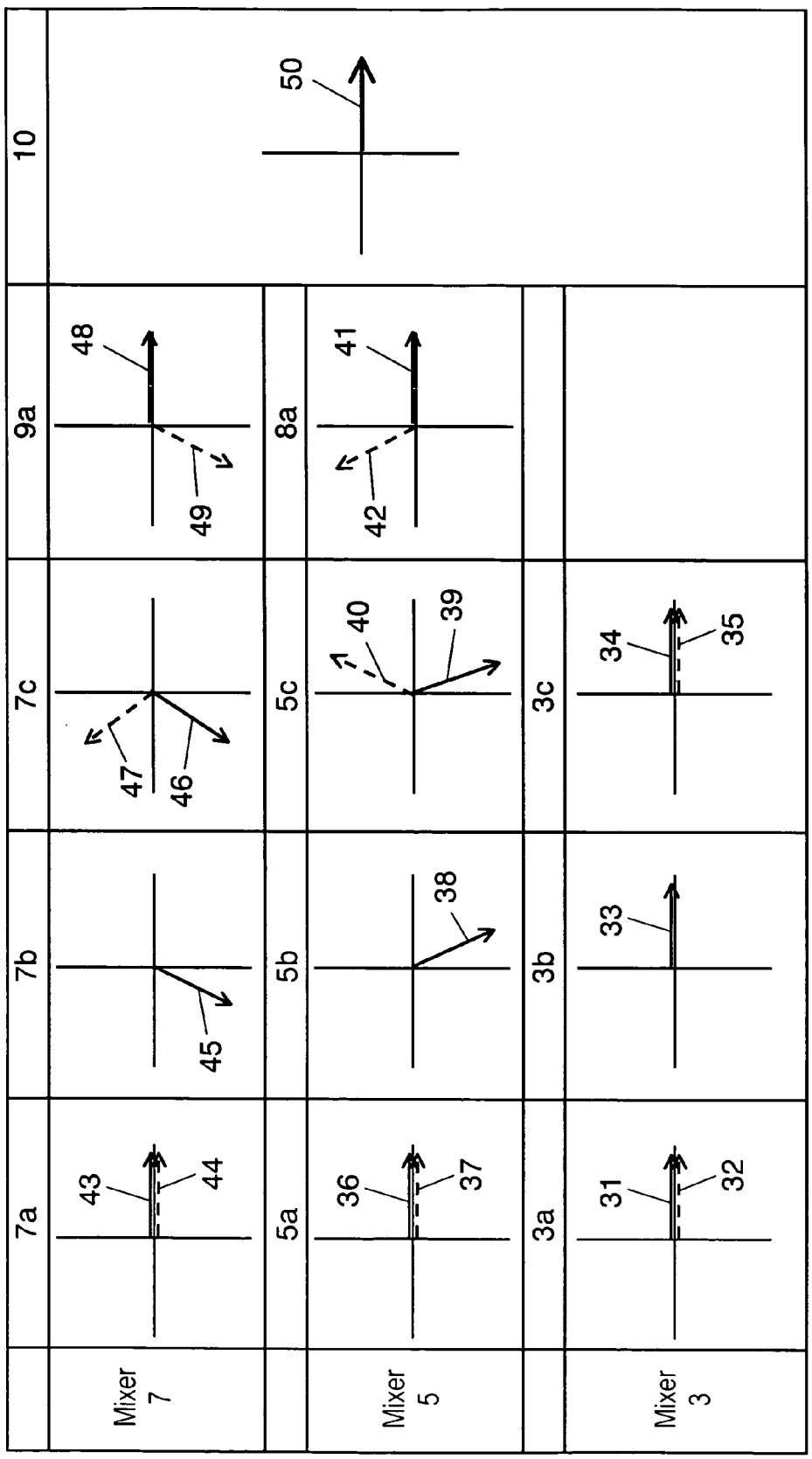
FIG. 2 is a phase chart of desired signal and image interfering signal at the mixer circuit in the exemplary embodiment 1 of the present invention.

FIG. 2 is a chart showing the phases of desired signal and image interfering signal at the mixer circuit in the exemplary embodiment 1 of the present invention. Also, FIG. 2 shows the phases of desired signal and image interfering signal at each part of the mixers 3, 5, 7, and the amplitudes are not represented. Here, the desired signal is shown by solid lines, and the image interfering signal is shown by dotted lines.

The configuration wherein desired signal is allowed to pass and image interfering signal is canceled will be described in the following with reference to FIG. 2.

Firstly, the phases of both desired signal 31 and image interfering signal 32 inputted to one input 3a of the mixer 3 are 0 radian. Also, the phase of signal 33 of oscillator 2 inputted to the other input 3b of the mixer 3 can be represented as 0 radian. On the other hand, from the formula 19, the desired signal 34 outputted as IF component from the output 3c of the mixer 3 becomes 0 radian in phase. Also, the image interfering signal 35 becomes 0 radian in phase.

Secondly, both of desired signal 36 and image interfering signal 37 inputted to one input 5a of the mixer 5 are 0 radian, same as the desired signal 31 and the image interfering signal 32 at the mixer 3. Signal 38 from the oscillator phase shifter 4 inputted to the other input 5b of the mixer 5 is phase-shifted by $-\pi/3$ radian as against the oscillator 2. Also, from the formula 20, the desired signal 39 outputted as IF component from the output 5*c* of mixer 5 is phase-shifted by $-\pi/3$ radian, while the image interfering signal 40 is phase-shifted by $\pi/3$ radian. Further, these signals are phase-shifted by $-5\pi/3$ radian by the intermediate frequency phase shifter 8. Accordingly, from the formula 21, desired signal 41 and image interfering signal 42 at output 8*a* can be represented as in FIG. 2.

Thirdly, both of desired signal 43 and image interfering signal 44 inputted to one input 7*a* of the mixer 7 are 0 radian in phase, same as the desired signal 31 and the image interfering signal 32 at the mixer 3. Signal 45 inputted to the other input 7*b* of the mixer 7 via the oscillator phase shifter 6 is phase-shifted by $-2\pi/3$ radian as against the phase of oscillator 2. Also, from the formula 22, the desired signal 46 outputted as IF component from the output 7*c* of the mixer 7 is phase-shifted by $-2\pi/3$ radian. Also, image interfering signal 47 is phase-shifted by $2\pi/3$ radian. Further, these signals are phase-shifted by $-4\pi/3$ radian by the intermediate frequency phase shifter 9. Accordingly, from the formula 23, the desired signal 48 and the image interfering signal 49 at output 9*a* can be represented as in FIG. 2.

Finally, desired signal 50 outputted as IF component from output terminal 10 is a composite signal of desired signals 34, 41 and 48. In this case, the signal is three times the amplitude of each desired signal because of being coincident in phase with each other.

Also, the image interfering signal outputted as IF component from output terminal 10 is a composite signal of image interfering signals 35, 42 and 49. In this case, the signal is canceled and not outputted because of being in equal interval relation of $2\pi/3$ each in phase with each other. This coincides with the result of calculation in the formula 24.

Next, such case that interfering signal Vm1 being at a lower side apart by IF as against a frequency three times higher than the fundamental frequency from the oscillator 2 and interfering signal Vm2 being at an upper side apart by IF as against a frequency three times higher than the fundamental frequency from the oscillator 2 are inputted to the input terminal 1 will be described by using calculating expressions.

The interfering signal Vm1 is represented by formula 25. Here, the angular frequency is $\omega_4$, and the phase angle is $-\theta_4$.

$$Vm1=\sin(\omega_4 t-\theta_4) \qquad \text{(formula 25)}$$

Further, the interfering signal Vm2 is represented by formula 26. Here, the angular frequency is $\omega_5$, and the phase angle is $-\theta_5$.

$$Vm2=\sin(\omega_5 t-\theta_5) \qquad \text{(formula 26)}$$

VL3*a* that is the tertiary higher harmonic component generated by a limiter circuit in the mixer 3 receiving the fundamental output component from the oscillator 2 is represented by formula 27.

$$VL3a=\sin(3\omega_2 t-3\theta_2) \qquad \text{(formula 27)}$$

VL3*b* that is the tertiary higher harmonic component generated by a limiter circuit in the mixer 5 receiving the fundamental output component from the oscillator 2 via the oscillator phase shifter 4 is represented by formula 28.

$$VL3b=\sin(3\omega_2 t-3\theta_2-3\pi/3) \qquad \text{(formula 28)}$$

VL3*c* that is the tertiary higher harmonic component generated by a limiter circuit in the mixer 7 receiving the fundamental output component from the oscillator 2 via the oscillator phase shifter 6 is represented by formula 29.

$$VL3c=\sin(3\omega_2 t-3\theta_2-6\pi/3) \qquad \text{(formula 29)}$$

Firstly, the interfering signals Vm1 and Vm2 are respectively divided into three signals to be inputted to one input 3*a* of the mixer 3. This is equivalent to a configuration such that VL3*b*, tertiary higher harmonic component, is inputted to the other input 3*b* of the mixer 3. Therefore, signal V (3*c*) represented by formula 30 is outputted as IF component from the output 3*c* of the mixer 3.

$$\begin{aligned}V(3c) &= 1/3 \times (Vm1+Vm2) \times VL3a \\ &= 1/3 \times (1/2 \times \cos(3\omega_2 t - \omega_4 t + \theta_4 - 3\theta_2) + \\ & \quad 1/2 \times \cos(\omega_5 t - 3\omega_2 t - \theta_5 + 3\theta_2))\end{aligned} \qquad \text{(formula 30)}$$

Secondly, same signal as that of the mixer 3 is inputted to one input 5*a* of the mixer 5. This is equivalent to a configuration such that VL3*b*, tertiary higher harmonic component, is inputted to the other input 5*b* of the mixer 5. Therefore, V (5*c*) outputted as IF component from the output 5*c* of mixer 5 can be represented by formula 31.

$$\begin{aligned}V(5c) &= 1/3 \times (Vm1+Vm2) \times VL3b \\ &= 1/3 \times (1/2 \times \\ & \quad \cos(3\omega_2 t - \omega_4 t + \theta_4 - 3\theta_2 - \pi) + \\ & \quad 1/2 \times \cos(\omega_5 t - 3\omega_2 t - \theta_5 + 3\theta_2 + \pi))\end{aligned} \qquad \text{(formula 31)}$$

Since V (5*c*) is phase-shifted by $-5\pi/3$ radian by the intermediate frequency phase shifter 8, V (8*a*) that is the output 8*a* of the intermediate frequency phase shifter 8 can be represented by formula 32.

$$V(8a)=\tfrac{1}{3} \times (\tfrac{1}{2} \times \cos(3\omega_2 t-\omega_4 t+\theta_4-3\theta_2-2\pi/3)+\tfrac{1}{2}\times\cos(\omega_5 t-3\omega_2 t-\theta_5+3\theta_2-2\pi/3)) \qquad \text{(formula 32)}$$

Thirdly, same signal as that of the mixer 3 is inputted to one input 7*a* of the mixer 7, but tertiary higher harmonic component VL3*c* generated by a limiter circuit in the mixer 7 is inputted to the other input 7*b* of the mixer 7 after the phase of oscillator 2 is shifted by $-2\pi/3$ radian by the oscillator phase shifter 6. Accordingly, signal V (7*c*) that is the output 7*c* of mixer 7 can be represented by formula 33.

$$\begin{aligned}V(7c) &= 1/3 \times (Vm1+Vm2) \times VL3c \\ &= 1/3 \times (1/2 \times \cos(3\omega_2 t-\omega_4 t+\theta_4-3\theta_2)+ \\ & \quad 1/2 \times \cos(\omega_5 t-3\omega_2 t-\theta_5+3\theta_2))\end{aligned} \qquad \text{(formula 33)}$$

Since V (7*c*) is phase-shifted by $-4\pi/3$ radian by the intermediate frequency phase shifter 9, V (9*a*) that is the output 9*a* of the intermediate frequency phase shifter 9 can be represented by formula 34.

$$V(9a)=\tfrac{1}{3}\times(\tfrac{1}{2}\times\cos(3\omega_2 t-\omega_4 t+\theta_4-3\theta_2-4\pi/3)+\tfrac{1}{2}\times\cos(\omega_5 t-3\omega_2 t-\theta_5+3\theta_2-2\pi/3)) \qquad \text{(formula 34)}$$

Finally, V (10) as IF component outputted from the output terminal 10 is a composite of V (3*c*), V (8*a*) and V (9*a*), which can be represented by formula 35.

$$V(10) = V(3c) + V(8a) + V(9a) \quad \text{(formula 35)}$$
$$= 0$$

As is obvious in formula 35, the first term of V (3c), the first term of V (8a) and the first term of V (9a) which are the IF components of interfering signal Vm1 are in $2\pi/3$ radian relation in phase with each other and canceled.

Consequently, the IF component of interfering signal Vm1 is not outputted from the output terminal 10.

On the other hand, the second term of V (3c), the second term of V (8a), and the second term of V (9a) which are the IF components of interfering signal Vm2 are canceled because of being in $2\pi/3$ radian relation in phase with each other. Namely, the IF component of interfering signal Vm2 is not outputted from the output terminal 10.

Figure 3:
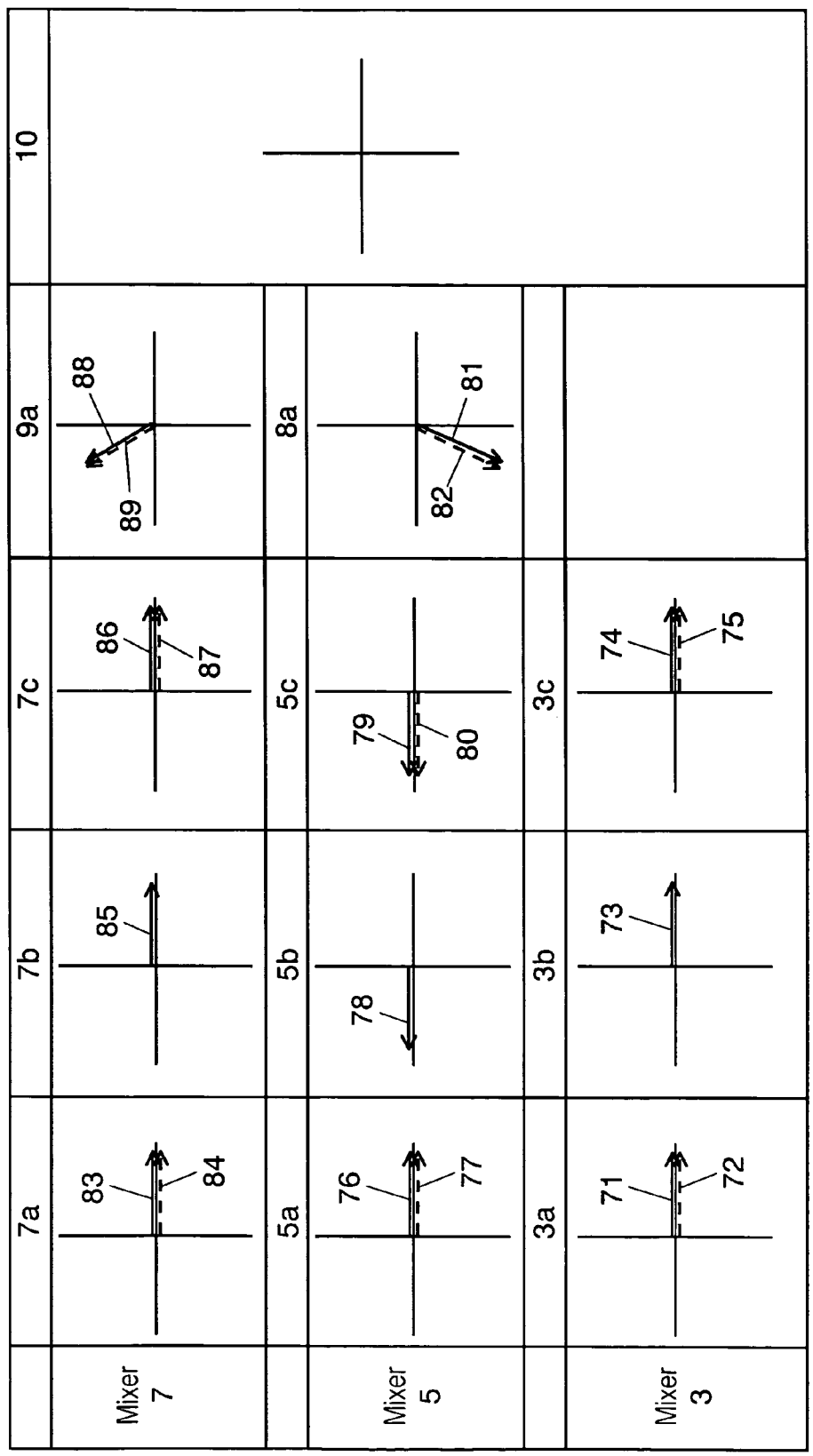
FIG. 3 is a phase chart of interfering signal related to a frequency three times higher as against the fundamental frequency from the mixer circuit in the exemplary embodiment 1 of the present invention.

FIG. 3 is a chart showing the phase of interfering signal related to a frequency three times higher than the fundamental frequency from the oscillator 2 at the mixer circuit in the exemplary embodiment 1 of the present invention.

FIG. 3 shows the phase of interfering signal at a lower side or upper side apart by IF as against a frequency three times higher than the fundamental frequency from the oscillator 2 at each part of the mixers 3, 5, 7, and the amplitudes are not represented. The interfering signal Vm1 is shown by solid lines, and the signal of Vm2 is shown by dotted lines.

The configuration wherein interfering signal related to a frequency three times higher as against the fundamental frequency of oscillator 2 is canceled will be described in the following with reference to FIG. 3.

Firstly, the interfering signals Vm1 and Vm2 inputted to one input 3a of the mixer 3 are respectively represented by signal 71 and signal 72. Also, from the formula 27, the signal outputted from the oscillator 2, the tertiary higher harmonic component VL3a generated in the mixer 3 is represented by formula 73. Further, the IF components of interfering signals Vm1 and Vm2 from the output 3c of mixer 3 can be represented by signal 74 and signal 75 respectively as is obvious in the formula 30.

Secondly, interfering signals Vm1 and Vm2 inputted to one input 5a of the mixer 5 are respectively represented by signal 76 and signal 77. Also, the fundamental output component of oscillator 2 is inputted to the other input of the mixer 5 after being phase-shifted by $-\pi/3$ radian by the oscillator phase shifter 4. In this case, as is obvious from the formula 28, VL3b that is the tertiary higher harmonic component generated by the limiter circuit in the mixer 5 can be represented by signal 78.

Further, the IF components of interfering signals Vm1 and Vm2 from the output 5c of the mixer 5 can be represented by signal 79 and signal 80 as is apparent in the formula 31. Next, the IF components of interfering signals Vm1 and Vm2 from the output 5c are phase-shifted by $-5\pi/3$ radian at the intermediate frequency phase shifter 8. Accordingly, at the output 8a, the signals are respectively represented by signal 81 and signal 82 as is apparent from the formula 32.

Thirdly, interfering signals Vm1 and Vm2 inputted to one input 7a of the mixer 7 are respectively represented by signal 83 and signal 84. Also, the fundamental output component of oscillator 2 is inputted to the other input 7b of the mixer 7 after being phase-shifted by $-2\pi/3$ radian by the oscillator phase shifter 6. In this case, as is obvious from the formula 29, VL3c that is the tertiary higher harmonic component generated by the limiter circuit in the mixer 7 can be represented by signal 85.

Further, interfering signals Vm1 and Vm2 from the output 7c of the mixer 7 can be represented by signal 86 and signal 87 respectively as is obvious from the formula 33. Next, the IF components of interfering signals Vm1 and Vm2 from the output 7c are phase-shifted by $-4\pi/3$ radian at the intermediate frequency phase shifter 9. Accordingly, at the output 9a, the signals can be represented by signal 88 and signal 89 respectively as is apparent from the formula 34.

Finally, the IF component of interfering signal Vm1 outputted from the output terminal 10 is a composite signal of signal 74, signal 81 and signal 88. However, since the signal 74, signal 81, and signal 88 are in equal interval relation of $2\pi/3$ each in phase with each other, these signals are canceled and not outputted from the output terminal 10.

Also, the IF component of interfering signal Vm2 outputted from the output terminal 10 is a composite signal of signal 75, signal 82 and signal 89. However, since the signal 75, signal 82, and signal 89 are in equal interval relation of $2\pi/3$ each in phase with each other, these signals are canceled and not outputted. This coincides with the result of calculation in the formula 35.

At the time, the output signal from oscillator 2 is inputted to the other input of mixers 3, 5, 7. Then, in order to enhance the basic performance of the mixer, the output amplitude from the oscillator 2 is sufficiently raised by the amplifier in the mixers 3, 5, 7. Or, it is used as a mixer by switching the receive signal after sufficiently raising the amplitude by the amplifier in the mixer, for example, after changing it to rectangular wave signal by a limiter circuit.

Here, even in case the higher harmonic component of the oscillator 2 itself is of low amplitude, higher harmonic component is generated by an amplifier or limiter circuit in the mixers 3, 5, 7 at the later stage. In this case, the amplitude of even higher harmonic component is relatively low, but the amplitude of odd higher harmonic component is high in particular. Also, the tertiary higher harmonic component close to the fundamental component of oscillator 2 or quinary higher harmonic component is outputted at a high amplitude. If there exists an interfering signal in a frequency being at a lower side or upper side apart by IF as against the higher harmonic component, the signal reception will be affected and it may sometimes become unable to receive the signal.

Figure 15:
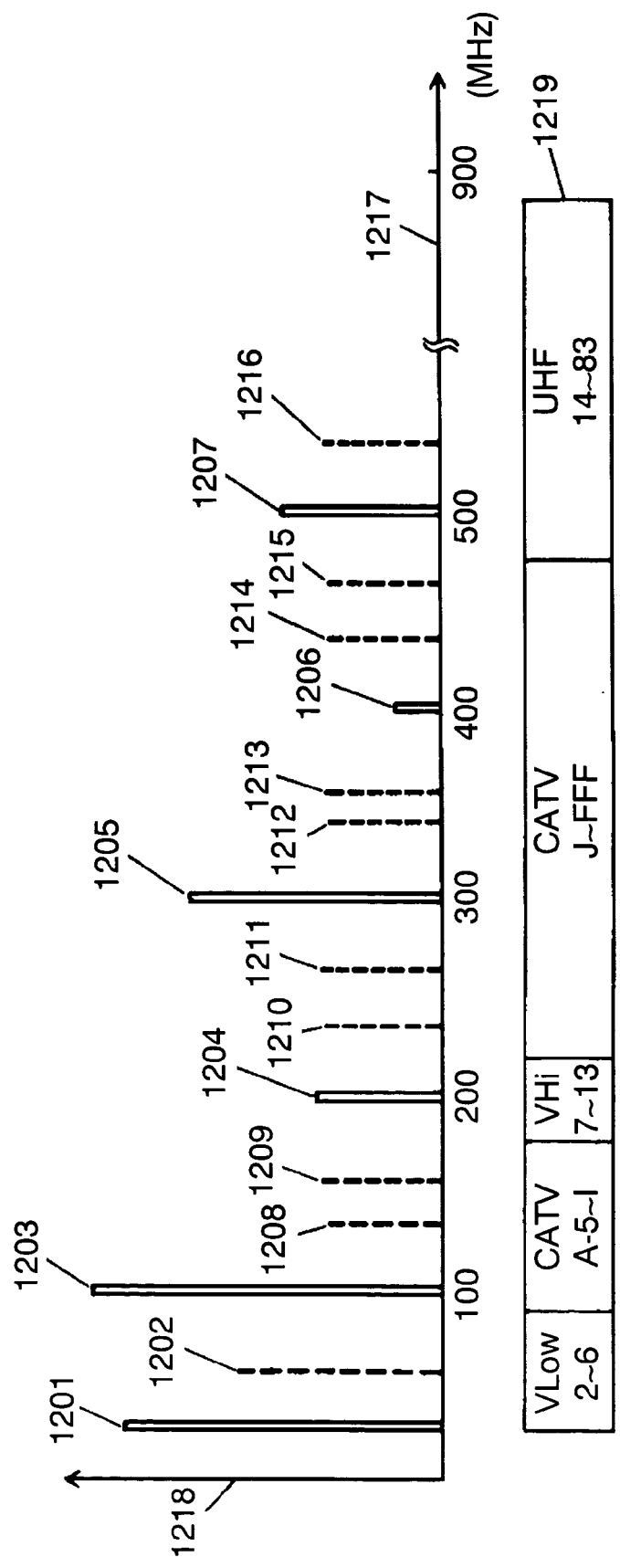
FIG. 15 is a diagram of relationship between broadcasting channels and interfering signals related to high frequencies of oscillator in North America.
Figure 16:
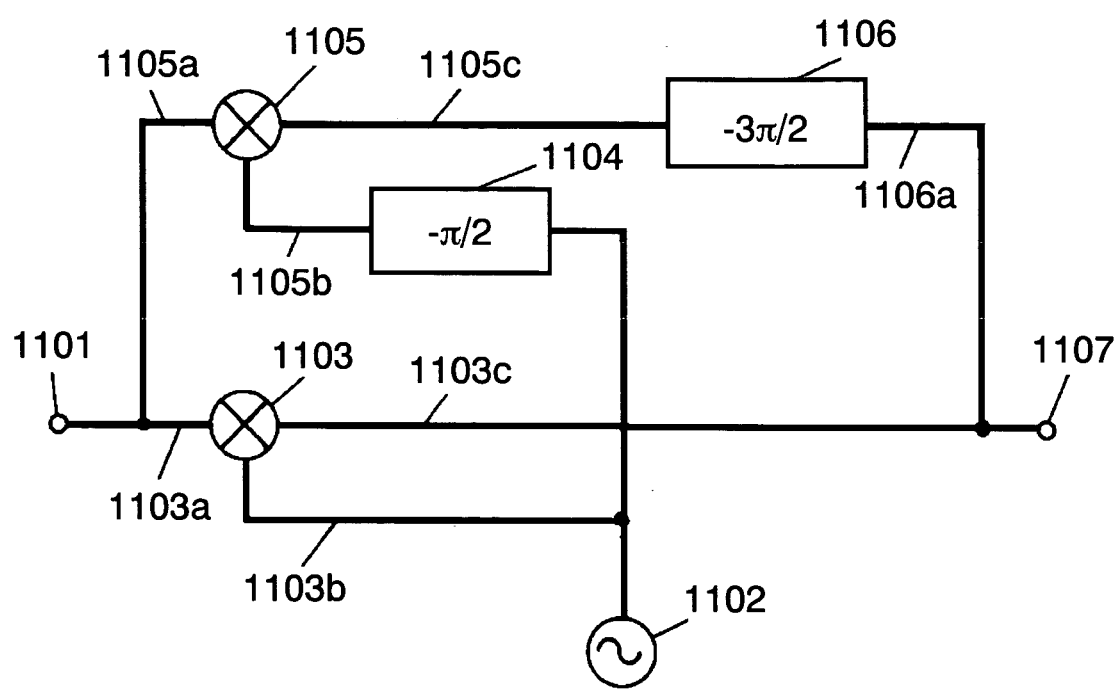
FIG. 16 is a block diagram of a conventional mixer circuit.
Figure 17:
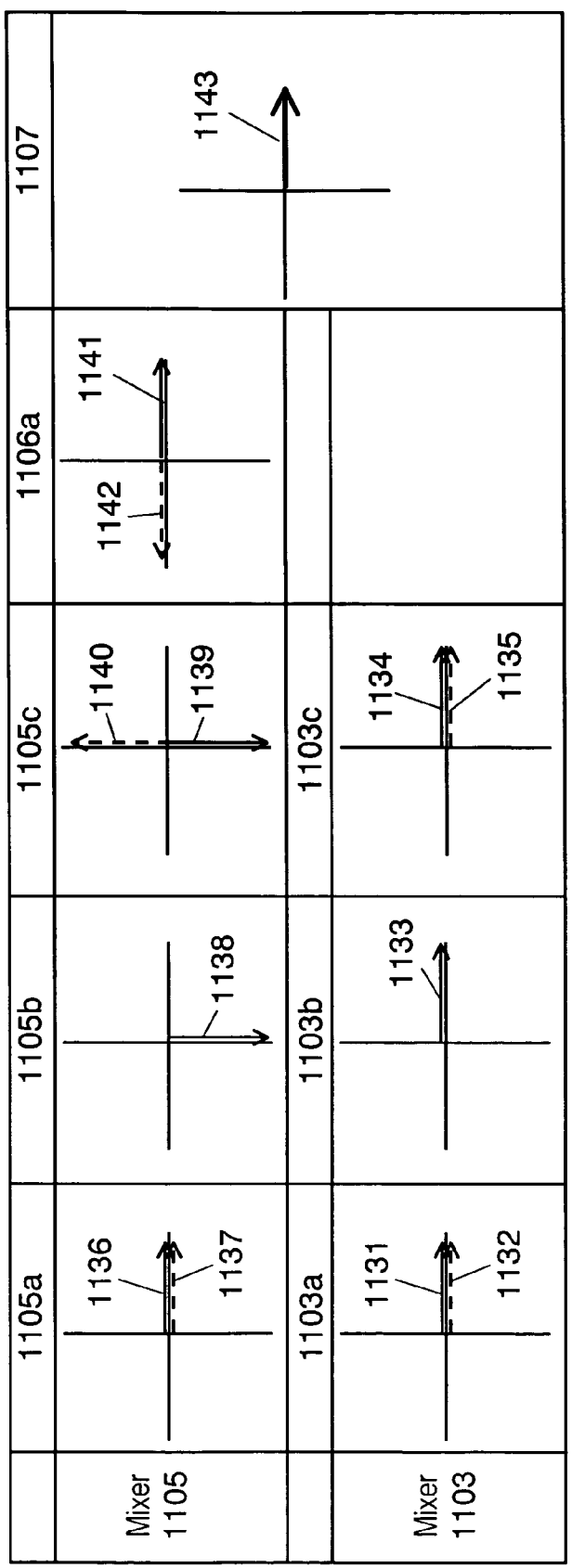
FIG. 17 is a phase chart of desired signal and image interfering signal at a conventional mixer circuit.
Figure 18:
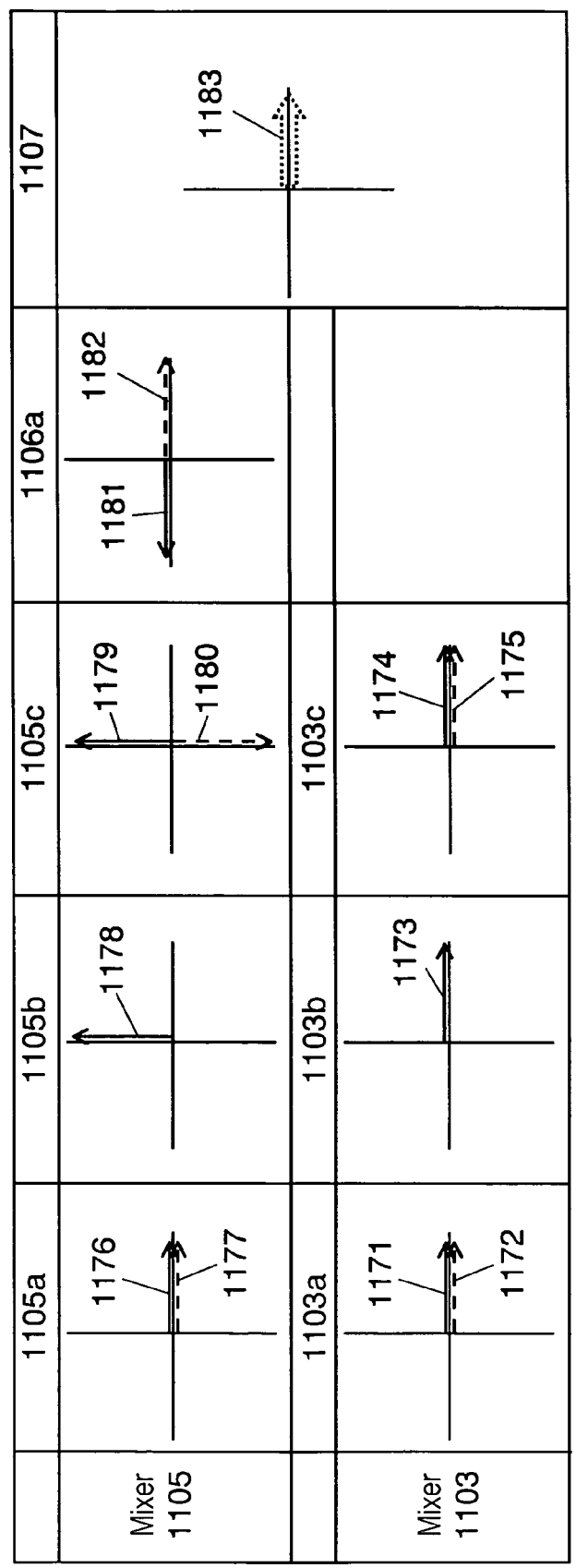
FIG. 18 is a phase chart of interfering signal related to a frequency three times higher as against the fundamental frequency of the oscillator at a conventional mixer circuit.

FIG. 15 shows the relationship between broadcasting channels in North America and interfering signals related to higher harmonic frequencies of oscillators.

In FIG. 15, horizontal axis 1217 stands for frequency axis, and vertical axis 1218 stands for the amplitude of signal. Frequency allocation 1219 stands for the broadcasting channel of television or CATV in North America, and the broadcasting is executed by using frequency range of about 50 MHz to about 900 MHz. For example, suppose signal 1202, channel 2 belonging to a frequency bandwidth called "VLow," is received, then the fundamental frequency 1203 of oscillator 2 is approximately 100 MHz. Signal 1202 is a desired signal inputted to the input terminal 1, and its frequency is approximately 55 MHz. Signal 1208 is outputted as an image interfering signal against signal 1202 that is a desired signal, and signal 1201 is IF signal outputted to the output terminal 10.

Here, a frequency component two times higher than the fundamental frequency 1203 is signal 1204, a frequency component three times higher is signal 1205, a frequency component four times higher is signal 1206, and a frequency component five times higher is signal 1207. Further, a signal of a frequency lower by IF than the frequency component 1204 of two times higher is signal 1209, a signal of a frequency higher by IF than the frequency component 1204 of two times higher is signal 1210, a signal of a frequency lower by IF than the frequency component 1205 of three times higher is signal 1211, a signal of a frequency higher by IF than the frequency component 1205 of three times higher is signal 1212, a signal of a frequency lower by IF than the frequency component 1206 of four times higher is signal 1213, a signal of a frequency higher by IF than the frequency component 1206 of four times higher is signal 1214, a signal of a frequency lower by IF than the frequency component 1207 of five times higher is signal 1215, and a signal of a frequency higher by IF than the frequency component 1207 of four times higher is signal 1216.

When the signal from the oscillator is changed to a rectangular wave signal by a limiter circuit for the purpose of frequency mixing, its higher harmonic components are generated. A signal existing in a frequency lower by IF from the frequency of each higher harmonic component generated appears at the frequency of IF signal of the frequency mixing output. Also, a signal existing in a frequency higher by IF from the frequency of each higher harmonic component generated appears at the frequency of IF component of the frequency mixing output. That is, a signal existing in a frequency apart by IF from each higher harmonic component of the signal from the oscillator appears at the frequency of IF signal of the frequency mixing output as an image signal.

Then, the frequencies of signal 1211, signal 1212, signal 1215, etc. are frequencies within the frequency band of CATV channel. Also, signal 1216 is a frequency within the frequency band of UHF channel. That is, each of the broadcasting signal existing in CATV channel and the broadcasting signal existing in UHF channel is an interfering signal. That is, when a channel of low frequency is received, it represents that the broadcasting channel existing in a frequency higher than the receiving channel becomes an interfering signal, and it results in a combination such that the lower the frequency of the channel received, the interfering signal is more increased.

The exemplary embodiment 1 of the present invention is HRM of which the numeral "M" equivalent to the number of mixers is 3. Table 2 shows the fundamental output component of oscillator 2 when "M" is 3 and whether or not the interfering signal related to the higher harmonic component can be suppressed.

In Table 2, when "n" representing the multiple of the fundamental frequency of oscillator 2 is 1, it shows the fundamental frequency of the oscillator 2, (fundamental−IF) stands for a desired signal whose frequency is lower by IF than the fundamental frequency. (Fundamental+IF) stands for an image interfering signal whose frequency is higher by IF than the fundamental frequency. "O" shows that it is effective to suppress the image interfering signal.

TABLE 2

|  | As against n times × (fundamental) − IF | | As against n times × (fundamental) + IF | |
| --- | --- | --- | --- | --- |
|  | Input frequency | Effects | Input frequency | Effects |
| n = 1 | Fundamental frequency − IF | Desired signal | Image interference | o |

TABLE 2-continued

|  | As against n times × (fundamental) − IF | | As against n times × (fundamental) + IF | |
| --- | --- | --- | --- | --- |
|  | Input frequency | Effects | Input frequency | Effects |
| n = 3 | 3 times × fundamental frequency − IF | o | 3 times × fundamental frequency + IF | o |
| n = 5 | 5 times × fundamental frequency − IF | o | 5 times × fundamental frequency + IF | x |
| n = 7 | 7 times × fundamental frequency − IF | x | 7 times × fundamental frequency + IF | o |
| n = 9 | 9 times × fundamental frequency − IF | o | 9 times × fundamental frequency + IF | o |
| n = 11 | 11 times × fundamental frequency − IF | o | 11 times × fundamental frequency + IF | x |
| n = 13 | 13 times × fundamental frequency − IF | x | 13 times × fundamental frequency + IF | o |
| . | . | . | . | . |
| . | . | . | . | . |
| . | . | . | . | . | o - effective to suppress, able to eliminate.
x - not effective to suppress, unable to eliminate.

Further, when n=3, it shows that it is effective to suppress the interfering signal of "3 times×fundamental frequency+IF" (signal of a frequency higher by IF than a frequency three times the fundamental frequency) and "3 times×fundamental frequency−IF" (signal of a frequency lower by IF than a frequency three times the fundamental frequency). Also, when n is 5, it shows that it is effective to suppress the interfering signal of "5 times×fundamental frequency−IF" (signal of a frequency lower by IF than a frequency five times the fundamental frequency). "x" shows that it is not effective to suppress.

Thus, in HRM configured with M=3, it is able to suppress an interfering signal at an upper side or lower side apart by IF signal frequency as against a frequency three times the fundamental frequency from the oscillator 2, and an interfering signal at a lower side apart by IF signal frequency as against a frequency five times the fundamental frequency from the oscillator 2, which provides an excellent signal receiving condition.

In this way, the frequency of interfering signal related to the higher harmonic component of the fundamental output component of the oscillator 2 can be raised about 200 MHz higher as compared with the conventional example. Therefore, the filter attenuation characteristic of the input circuit connected to the input of the mixer circuit can be relieved and it is possible to further reduce the size and cost as a high-frequency receiver.

Exemplary Embodiment 2

Figure 4:
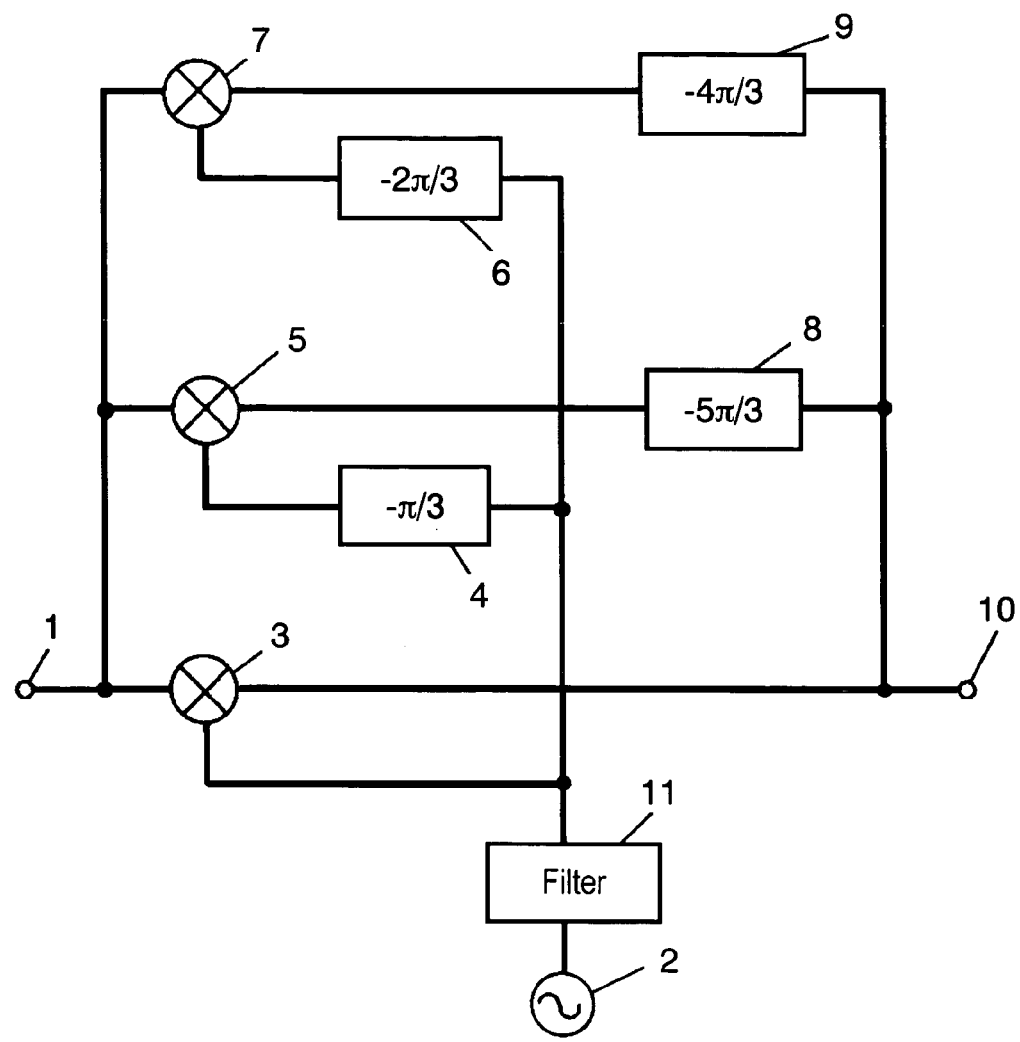
FIG. 4 is a block diagram of a mixer circuit in the exemplary embodiment 2 of the present invention.

FIG. 4 is a block diagram of a mixer circuit in the exemplary embodiment 2 of the present invention.

In FIG. 4, filter 11 is directly inserted in the output of oscillator 2 in the exemplary embodiment 2. This point differs from the configuration of the exemplary embodiment 1. In the exemplary embodiment 2, those same as in the exemplary embodiment 1 are given same reference numerals for simplifying the description. The filter 11 is a band-pass filter or a low-pass filter which allows only the fundamental frequency of the oscillator 2 to pass.

The operation will be described in the following. When the oscillator 2 is operated in great amplitude or a semiconductor of poor linearity is used, a higher harmonic component approximate in amplitude to the fundamental output component is outputted from the oscillator 2 itself. The higher harmonic component becomes predominant, and it is sometimes unable to cancel the phase. Particularly, in the case of a tertiary higher harmonic component or quinary higher harmonic component that is odd higher harmonics nearly same as the fundamental component of the oscillator 2, there often arises a problem because the amplitude is relatively high.

Originally, tertiary higher harmonic component VL3$b$ generated by a limiter circuit in the mixer 5 after the fundamental output component, output from oscillator 2, passes through the oscillator phase shifter 4 is the formula 28. However, the tertiary higher harmonic component of the oscillator 2 itself is phase-shifted by $-\pi/3$ by the oscillator phase shifter 4 and becomes signal VL3$bb$ as shown in formula 36

$$VL3bb = \sin(3\omega_2 t - 3\theta_2 - \pi/3) \qquad \text{(formula 36)}$$

The signal VL3$bb$ differs in phase from VL3$b$, and cannot be canceled with respect to interfering signal at a lower side or upper side apart by IF as against a frequency three times higher than the fundamental frequency from the oscillator 2. This holds true for a frequency component of over three times higher, and the signal cannot be canceled.

In order to improve this, the filter 11 is inserted in the output of the oscillator 2. In this way, since a signal with higher harmonic component of oscillator 2 suppressed can be supplied to the other input of mixers 3, 5, 7, it is possible to suppress the interference more reliably.

As described above, since the tertiary or more higher harmonic component outputted from the oscillator is suppressed by the filter, a signal with tertiary or more higher harmonic component of the oscillator suppressed can be supplied to the other input of the first, second, and third mixers. Accordingly, interfering signal at a lower side or upper side apart by IF as against a frequency three times the fundamental frequency from the oscillator can be reliably suppressed.

Also, the oscillator 2 is also required to be of broad-band in order to receive broad-band signals. For example, in the case of oscillation in a wide range of frequencies from 100 MHz to 1000 MHz, there exists a frequency that becomes greater in higher harmonic component, and therefore, it is effective to insert the filter 11 for the purpose of improvement. The filter 11 is preferable to be a fixed type, variable type, or changeover type that is changed over according to the receiving band. However, it is desirable to use a bandpass filter which changes in central frequency, following the output frequency of the oscillator 2.

Exemplary Embodiment 3

Figure 5:
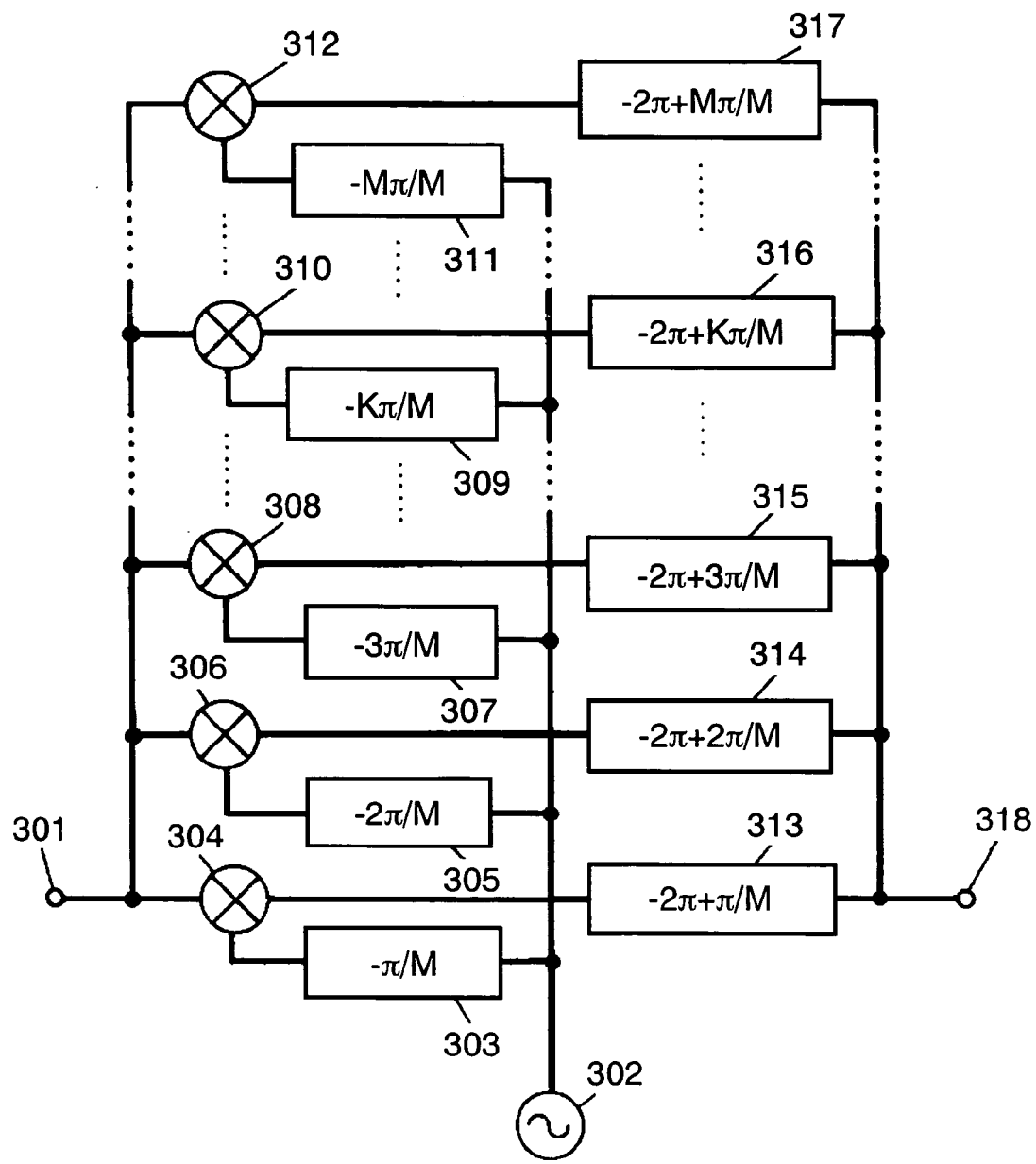
FIG. 5 is a block diagram of a mixer circuit in the exemplary embodiment 3 of the present invention.

FIG. 5 is a block diagram of a mixer circuit in the exemplary embodiment 3 of the present invention.

In FIG. 5, the high frequency signal inputted to the input terminal 301 is divided and connected to one inputs of M pieces of mixers 304, 306, 308, 310, 312. Also, the outputs of oscillator 302 phase-shifted by $-K\pi/M$ radian each by M pieces of oscillator phase shifters 303, 305, 307, 309, 311 are connected to the other inputs of M pieces of mixers 304, 306, 308, 310, 312. Here, M is a natural number of 3 or over, and K is a natural number from 1 to M with 1 added each.

Further, between the output of M pieces of mixers 304, 306, 308, 310, 312 and the output terminal 318 are respectively connected M pieces of intermediate frequency phase shifters 313, 314, 315, 316, 317 with phase-shift amount of $-2\pi-(-K\pi/M)$ radian corresponding to the phase-shift amount $-K\pi/M$ radian of oscillator phase shifters 303, 305, 307, 309, 311.

In this case, similar effects can be obtained when M pieces of intermediate frequency phase shifters 313, 314, 315, 316, 317 with phase-shift amount of $K\pi/M$ radian corresponding to the phase-shift amount $-K\pi/M$ radian of oscillator phase shifters 303, 305, 307, 309, 311 are respectively connected to the outputs of M pieces of mixers 304, 306, 308, 310, 312.

The operation of a mixer circuit having the above configuration will be described in the following.

The basic operation is same as that of the exemplary embodiment 1 having three mixers 3, 5, 7 shown in FIG. 1, but the difference is that M pieces of mixers are used in the exemplary embodiment 3. Due to the difference, it becomes possible to eliminate interfering signal at a lower side or upper side apart by IF each as against a frequency three times or more to 2M-3 times higher than the fundamental frequency from the oscillator 302.

When desired signal is first inputted to the input terminal 301, the signal is inputted to one inputs of M pieces of mixers 304, 306, 308, 310, 312. On the other hand, the signals of oscillator 302, phase-shifted by $-K\pi/M$ radian via M pieces of oscillator phase shifters 303, 305, 307, 309, 311, are respectively inputted to the other inputs of M pieces of mixers 304, 306, 308, 310, 312.

Further, desired signals phase-shifted to $-K\pi/M$ radian are respectively outputted from the outputs of mixers 304, 306, 308, 310, 312. The desired signals phase-shifted to $-K\pi/M$ radian are respectively phase-shifted by $-2\pi+K\pi/M$ radian by intermediate frequency phase shifters 313, 314, 315, 316, 317, and as a result, the phase $\theta d$ of desired signal at output terminal 318 becomes as shown in formula 37. Accordingly, these coincide in phase with each other because of $-2\pi$ radian, that is, 0 radian of phase shift.

$$\begin{aligned}\theta d &= -K\pi/M - 2\pi + K\pi/M \\ &= -2\pi\end{aligned} \qquad \text{(formula 37)}$$

That is, the IF component of desired signal is multiplied by M and outputted from the output terminal 318.

Next, when image interfering signal is inputted to the input terminal 301, it is inputted to the other input of M pieces of mixers 304, 306, 308, 310, 312. Signal phase-shifted by $-K\pi/M$ radian is inputted to the other respective inputs of M pieces of mixers 304, 306, 308, 310, 312 from the signal output of oscillator 302 via M pieces of oscillator phase shifters 303, 305, 307, 309, 311.

Further, image interfering signal phase-shifted by $+K\pi/M$ radian is outputted from the output of mixers 304, 306, 308, 310, 312 since the frequency of image interfering signal is higher than the frequency of oscillator 302. The image interfering signals phase-shifted by $+K\pi/M$ radian are respectively phase-shifted by $-2\pi+K\pi/M$ radian by M pieces of intermediate frequency phase shifters 313, 314, 315, 316, 317. Accordingly, all of phases $\theta i$ of image interfering signal at the output terminal 318 become as shown in formula 38 as a result.

$$\theta i = K\pi/M - 2\pi + K\pi/M \quad \text{(formula 38)}$$
$$= K2\pi/M$$

Namely, it becomes a component having a phase of $K \times 2\pi/M$ radian, and since the component with $2\pi$ equally divided into M turn into M components resulting in phase canceling. That is, the IF component of image interfering signal becomes 0, and no signal is outputted from the output terminal 318.

Further, when interfering signals at a lower side or upper side apart by IF as against a frequency n times higher than the fundamental frequency from the oscillator 302 are inputted to the input terminal 301, the signals are inputted to one respective inputs of M pieces of mixers 304, 306, 308, 310, 312. To the other inputs of M pieces of mixers 304, 306, 308, 310, 312 are inputted signals phase-shifted by $-K\pi/M$ radian by M pieces of oscillator phase shifters 303, 305, 307, 309, 311. However, limiter circuits in the mixers 304, 306, 308, 310, 312 generate n-th higher harmonic components of $-K\pi n/M$ radian. Further, interfering signals at an upper side or lower side apart by IF as against a frequency n times higher than the fundamental frequency from the oscillator 302 are respectively phase-shifted by $K\pi n/M$ radian and $-K\pi n/M$ radian and outputted from the outputs of mixers 304, 306, 308, 310, 312. The signals phase-shifted by $K\pi n/M$ radian and $-K\pi n/M$ radian are respectively phase-shifted by $-2\pi + K\pi/M$ radian by intermediate frequency phase shifters 313, 314, 315, 316, 317. Consequently, phase $\theta m1$ of spurious signal from the output terminal 318 due to interfering signal at a lower side apart by IF as against a frequency n times higher than the fundamental frequency from the oscillator 302 becomes as shown in formula 39.

$$\theta m1 = -K\pi n/M - 2\pi + K\pi/M \quad \text{(formula 39)}$$
$$= K\pi(1-n)/M$$

Also, phase $\theta m2$ of spurious signal from the output terminal 318 due to interfering signal at an upper side apart by IF from a frequency n times higher than the fundamental frequency from the oscillator 302 becomes as shown in formula 40.

$$\theta m2 = K\pi n/M - 2\pi + K\pi/M \quad \text{(formula 40)}$$
$$= K\pi(1+n)/M$$

For example, when the number of mixers is 5 (M=5), and "n" that is the multiple of the fundamental frequency from the oscillator 302 is 5, the phase $\theta m1$ is $K\pi 4/5$ radian, meaning that there exist five signals with a phase of $4\pi$ radian divided into five phases. On the other hand, the phase $\theta m2$ becomes $K\pi 6/5$ radian, meaning that there exist five signals with a phase of $6\pi$ radian divided into five phases. Accordingly, these are subjected to phase canceling.

However, when the number of mixers is 5 (M=5), and "n" that is the multiple of the fundamental frequency from the oscillator 302 is 9, the phase $\theta m1$ is $K\pi 8/5$ radian, and the phase $\theta m2$ becomes $K\pi 10/5$ radian. Here, since $K\pi 10/5$ radian is $K2\pi$ radian, there exist five signals being coincident in phase with each other. Therefore, these are not canceled. Also, $K\pi 8/5$ radian means that there exist five signals with a phase of $8\pi$ radian divided into five phases, resulting in phase canceling.

Table 3 shows degrees of suppression against interfering signals related to higher harmonic component generated due to the fundamental output component of the oscillator 302 with respect to HRM whose M is 5 in the exemplary embodiment 3 of the present invention.

TABLE 3

| | As against n times × (fundamental) − IF | | As against n times × (fundamental) + IF | |
|---|---|---|---|---|
| | Input frequency | Effects | Input frequency | Effects |
| n = 1 | Fundamental frequency − IF | Desired signal | Image interference | o |
| n = 3 | 3 times × fundamental frequency − IF | o | 3 times × fundamental frequency + IF | o |
| n = 5 | 5 times × fundamental frequency − IF | o | 5 times × fundamental frequency + IF | o |
| n = 7 | 7 times × fundamental frequency − IF | o | 7 times × fundamental frequency + IF | o |
| n = 9 | 9 times × fundamental frequency − IF | o | 9 times × fundamental frequency + IF | x |
| n = 11 | 11 times × fundamental frequency − IF | x | 11 times × fundamental frequency + IF | o |
| n = 13 | 13 times × fundamental frequency − IF | o | 13 times × fundamental frequency + IF | o |
| . | . | . | . | . |
| . | . | . | . | . |
| . | . | . | . | . | o - effective to suppress, able to eliminate.
x - not effective to suppress, unable to eliminate.

In Table 3, in the case of HRM whose M is 5, all of image interfering signal, interfering signals at an upper side and lower side apart by IF as against frequencies 3 times, 5 times and 7 times higher than the fundamental frequency of oscillator 302, and interfering signals at a lower side apart by IF as against a frequency 9 times higher than the fundamental frequency from the oscillator 302 are suppressed because of phase canceling.

Table 4 shows degrees of suppression against interfering signals related to higher harmonic component generated due to the fundamental output component of the oscillator 302 with respect to multiple-stage HRM whose number of mixers is M in the exemplary embodiment 3 of the present invention.

In Table 4, in the case of multiple-stage HRM whose number of mixers is M, all of image interfering signal, interfering signals at a lower side and upper side apart by IF as against frequencies 3 times to 2M−3 times higher than the fundamental frequency of oscillator 302 are suppressed because of phase canceling. Also, Table 4 shows that interfering signals at a lower side and upper side apart by IF as against a frequency over 2M−2 times higher than the fundamental frequency are sometimes suppressed and sometimes not suppressed.

TABLE 4

| | As against n times × (fundamental) − IF | | As against n times × (fundamental) + IF | |
|---|---|---|---|---|
| | Input frequency | Effects | Input frequency | Effects |
| n = 1 | Fundamental frequency − IF | Desired signal | Image interference | o |
| n = 3 | 3 times × fundamental frequency − IF | o | 3 times × fundamental frequency + IF | o |
| n = 5 | 5 times × fundamental frequency − IF | o | 5 times × fundamental frequency + IF | o |
| n = 7 | 7 times × fundamental frequency − IF | o | 7 times × fundamental frequency + IF | o |
| n = 9 | 9 times × fundamental frequency − IF | o | 9 times × fundamental frequency + IF | o |
| n = 11 | 11 times × fundamental frequency − IF | o | 11 times × fundamental frequency + IF | o |
| n = 13 | 13 times × fundamental frequency − IF | o | 13 times × fundamental frequency + IF | o |
| . | . | | . | . |
| . | . | | . | . |
| . | . | | . | . |
| n = 2M − 3 | (2M − 3) times × fundamental frequency − IF | o | (2M − 3) times × fundamental frequency + IF | o |
| n = 2M − 2 | (2M − 2) times × fundamental frequency − IF | o | (2M − 2) times × fundamental frequency + IF | x |
| n = 2M − 1 | (2M − 1) times × fundamental frequency − IF | x | (2M − 1) times × fundamental frequency + IF | o |
| . | . | | . | . |
| . | . | | . | . |
| . | . | | . | . | o - effective to suppress, able to eliminate.
X - not effective to suppress, unable to eliminate.

As described above, as in the exemplary embodiment 3, it is possible to suppress image interfering signal and interfering signals existing at a lower side and upper side apart by IF as against all frequencies 3 times to 2M−3 times higher than the fundamental frequency from the oscillator.

Also, in the exemplary embodiment 3 of the present invention, it is possible to integrate at least the mixer 302 and oscillator phase shifters 303, 305, 307, 309, 311 in same package. Particularly, the variations among oscillator phase shifters can be suppressed by integrating at least the mixer and oscillator phase shifters in same package. This is also appropriate for size reduction.

Also, in the exemplary embodiment 3, it is possible to integrate at least mixers 304, 306, 308, 310, 312 and oscillator phase shifters 303, 305, 307, 309, 311 and intermediate frequency phase shifters 312, 314, 315, 316, 317 in same package. Particularly, the variations among oscillator phase shifters and intermediate frequency phase shifters can be suppressed by integrating at least the mixer and oscillator phase shifters and intermediate frequency phase shifters in same package. This is also appropriate for size reduction.

Exemplary Embodiment 4

Figure 6:
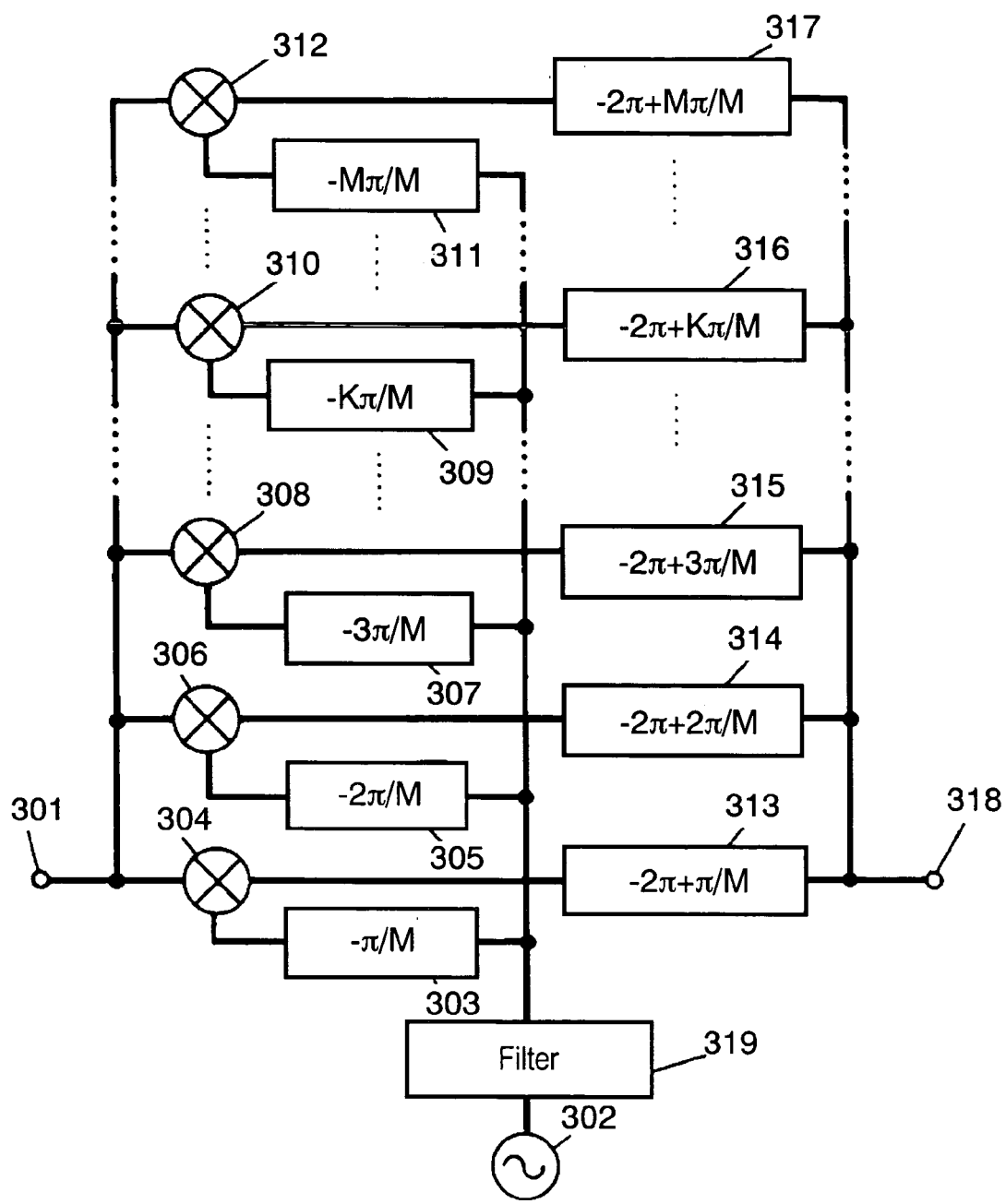
FIG. 6 is a block diagram of a mixer circuit in the exemplary embodiment 4 of the present invention.

FIG. 6 shows a block diagram of a mixer circuit in the exemplary embodiment 4 of the present invention.

In the exemplary embodiment 4, filter 319 is directly inserted in the output of oscillator 302. This point differs from the configuration of the exemplary embodiment 3. Those same as in the exemplary embodiment 3 are given same reference numerals for simplifying the description. The filter 319 is a band-pass filter or a low-pass filter which allows only the fundamental frequency of the oscillator 302 to pass.

The operation will be described with respect to the mixer circuit configured as described above.

When the oscillator 302 is operated in great amplitude or a semiconductor of poor linearity is used, a higher harmonic component of odd times higher approximate in amplitude to the fundamental output component becomes increased. Particularly, there often arises a problem because a tertiary higher harmonic component or quinary higher harmonic component that is higher harmonic component of odd times and near the fundamental component of the oscillator 302 is relatively high in amplitude.

M pieces of mixers are used in the exemplary embodiment 4, and the configuration of M=3 is same as in the exemplary embodiment 2. Accordingly, when the output signal of oscillator 302 itself is greater in higher harmonic component as compared with the fundamental wave, the great higher harmonic component becomes predominant same as in the exemplary embodiment 2 and it is unable to cancel the phase. Therefore, it becomes unable to cancel interfering signals related to a frequency n times higher than the fundamental frequency of the oscillator 302.

In order to improve this, the filter 319 is inserted in the output of the oscillator 302. In this way, since a signal with higher harmonic component of oscillator 302 suppressed can be supplied to the other input of M pieces of mixers 304, 306, 308, 310, 312. Accordingly, it is possible to suppress the spurious component more reliably.

Also, the oscillator 302 is required to be of broad-band in order to receive broad-band signals, and in oscillation at broad-band frequencies, the higher harmonic component is to be higher in amplitude, and it is effective to insert the filter 319 for the purpose of improvement. The filter 319 is preferable to be a fixed type, variable type, or changeover type that is changed over according to the receiving band.

As described above, in the exemplary embodiment 4, the higher harmonic component outputted from the oscillator can be suppressed by the filter, and signal with higher harmonic component of the oscillator suppressed can be supplied to the all other inputs of the first to M-th mixers. Accordingly, it is able to more reliably suppress the interference due to interfering signal at a lower side and upper side apart by IF as against all frequencies 3 times to 2M−3 times higher than the fundamental frequency from the oscillator.

Exemplary Embodiment 5

Figure 7:
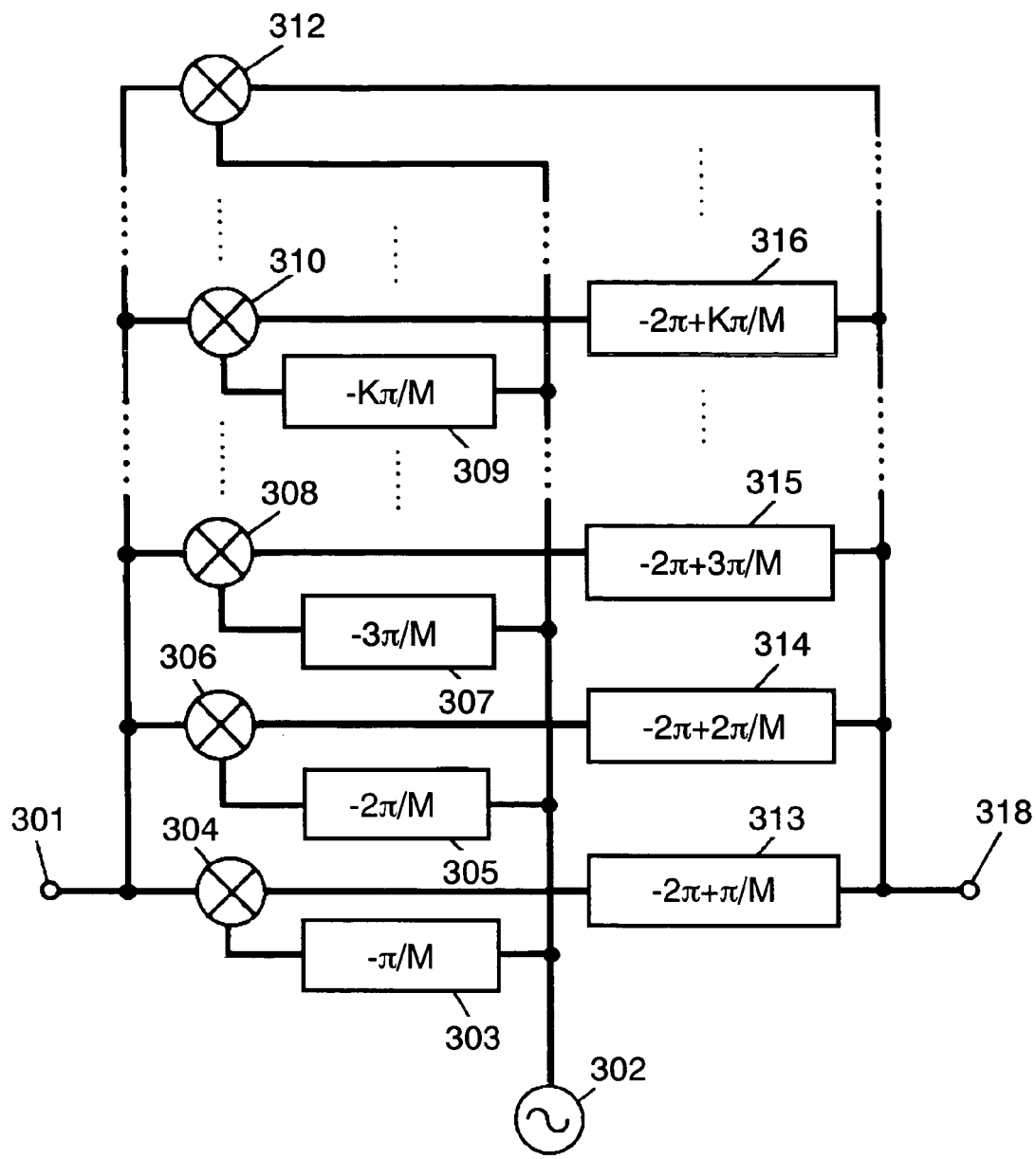
FIG. 7 is a block diagram of a mixer circuit in the exemplary embodiment 5 of the present invention.

FIG. 7 shows a block diagram of a mixer circuit in the exemplary embodiment 5 of the present invention.

In FIG. 7, the difference shown is such that the M-th oscillator phase shifter 311 and the M-th intermediate frequency phase shifter 317 in the exemplary embodiment 4 are excluded in the exemplary embodiment 5. Those same as in the exemplary embodiment 4 are given same reference numerals, and the description is omitted.

When the insertion loss is little with respect to the oscillator phase shifters 303, 305, 307, 309 connected to the other input of M−1 pieces of mixers 304, 306, 308, 310, it is possible to make direct connection, excluding the M-th oscillator phase shifter. Also, when the insertion loss is little with respect to the intermediate frequency phase shifters 313, 314, 315, 316 connected to the output of M−1 pieces of mixers 304, 306, 308, 310, it is possible to make direct connection, excluding the M-th intermediate frequency phase shifter.

Exemplary Embodiment 6

Figure 8:
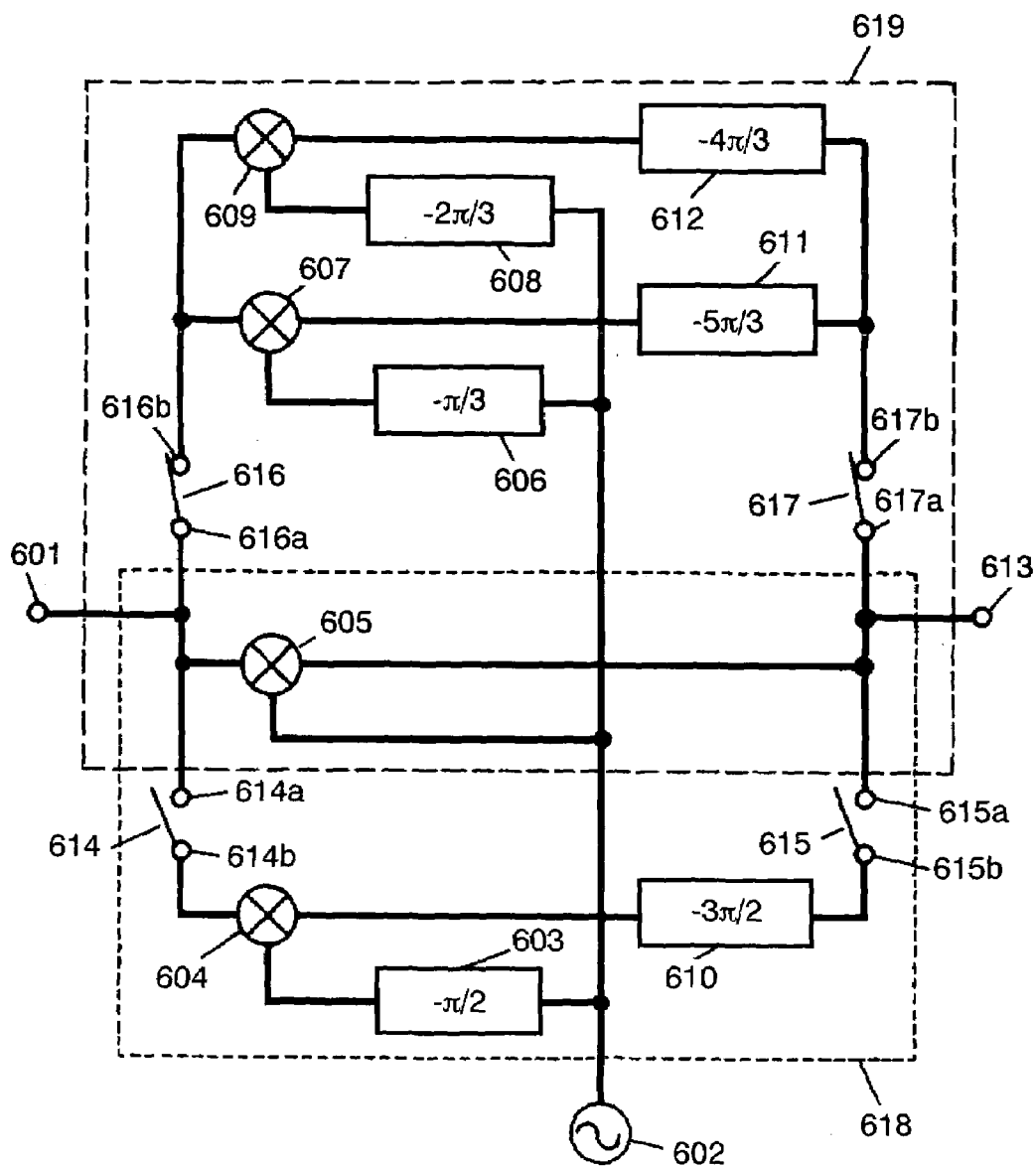
FIG. 8 is a block diagram of a mixer circuit in the exemplary embodiment 6 of the present invention.

FIG. 8 is a block diagram of a mixer circuit in the exemplary embodiment 6 of the present invention.

In FIG. 8, the mixer circuit in the exemplary embodiment 6 comprises the second mixer circuit 618 (hereafter called mixer circuit 618) as IRM, and the first mixer circuit 619 (hereafter called mixer circuit 619) as HRM. These mixer circuits 618 and 619 are properly switched by switching means 614, 615 and 616, 617 provided with electronic circuits. The switching signals of the switching means 614, 615, 616, 617 are given externally. The mixer circuit 619 is a type of mixer circuit shown in the exemplary embodiment 1.

First, the mixer circuit 618 as IRM is described. In FIG. 8, the input terminal 601 is connected to terminal 614a of switching means 614 and one input of the mixer 605.

The other input of mixer 605 is directly connected to the oscillator 602. Also, the output of mixer 605 is connected to the output terminal 613 and the terminal 615a of switching means 615.

Also, the terminal 614b of switching means 614 is connected to one input of the mixer 604, and also the output of oscillator 602 is connected to the other input of the mixer 604 via oscillator phase shifter 603 with phase shift of $-\pi/2$ radian. Also, the output of mixer 604 is connected to the terminal 615b of switching means 615 via intermediate frequency phase shifter 610 with phase shift of $-3\pi/2$ radian.

Next, mixer circuit 619 as HRM is described. The mixer circuit 619 and mixer circuit 618 share the input terminal 601 and output terminal 613 common with the mixer 605 and mixer 602.

The input terminal 601 is connected to the input terminal 616a of switching means 616. The terminal 616b of switching means 616 is connected to one input of the mixer 607, and also the output of oscillator 602 is connected to the other input of the mixer 607 via oscillator phase shifter 606 with phase shift of $-\pi/3$ radian. Also, the output of mixer 607 is connected to the terminal 617b of switching means 617 via intermediate frequency phase shifter 611 with phase shift of $-5\pi/3$ radian. And, the terminal 617a of switching means 617 is connected to the output terminal 613.

Also, the terminal 616b of switching means 616 is connected to one input of the mixer 609, and also the output of oscillator 602 is connected to the other input of the mixer 609 via oscillator phase shifter 608 with phase shift of $-2\pi/3$ radian. Also, the output of mixer 609 is connected to the terminal 617b of switching means 617 via intermediate frequency phase shifter 612 with phase shift of $-4\pi/3$ radian.

In a mixer circuit configured as described above, with switching means 616, 617 turned ON and switching means 614, 615 turned OFF, the mixer circuit 619 as HRM is selected. Also, with switching means 616, 617 turned OFF and switching means 614, 615 turned ON, the mixer circuit 618 as IRM can be selected.

By using such a configuration, even when there exists an interfering signal at an upper side and lower side apart by IF as against a frequency three times higher than the fundamental frequency from the oscillator 602, a good signal receiving condition can be obtained by selecting the mixer circuit 619 as HRM of which M is 3. Also, in case there exists only image interfering signal, the mixer circuit 618 as IRM is selected. In this way, proper switching can be done according to the service condition and signal receiving condition, enabling the reduction of power consumed, and the configuration is suited for portable equipment and the like. Also, it is suited for portable equipment and the like because switching can be done according to the place of signal reception.

Exemplary Embodiment 7

Figure 9:
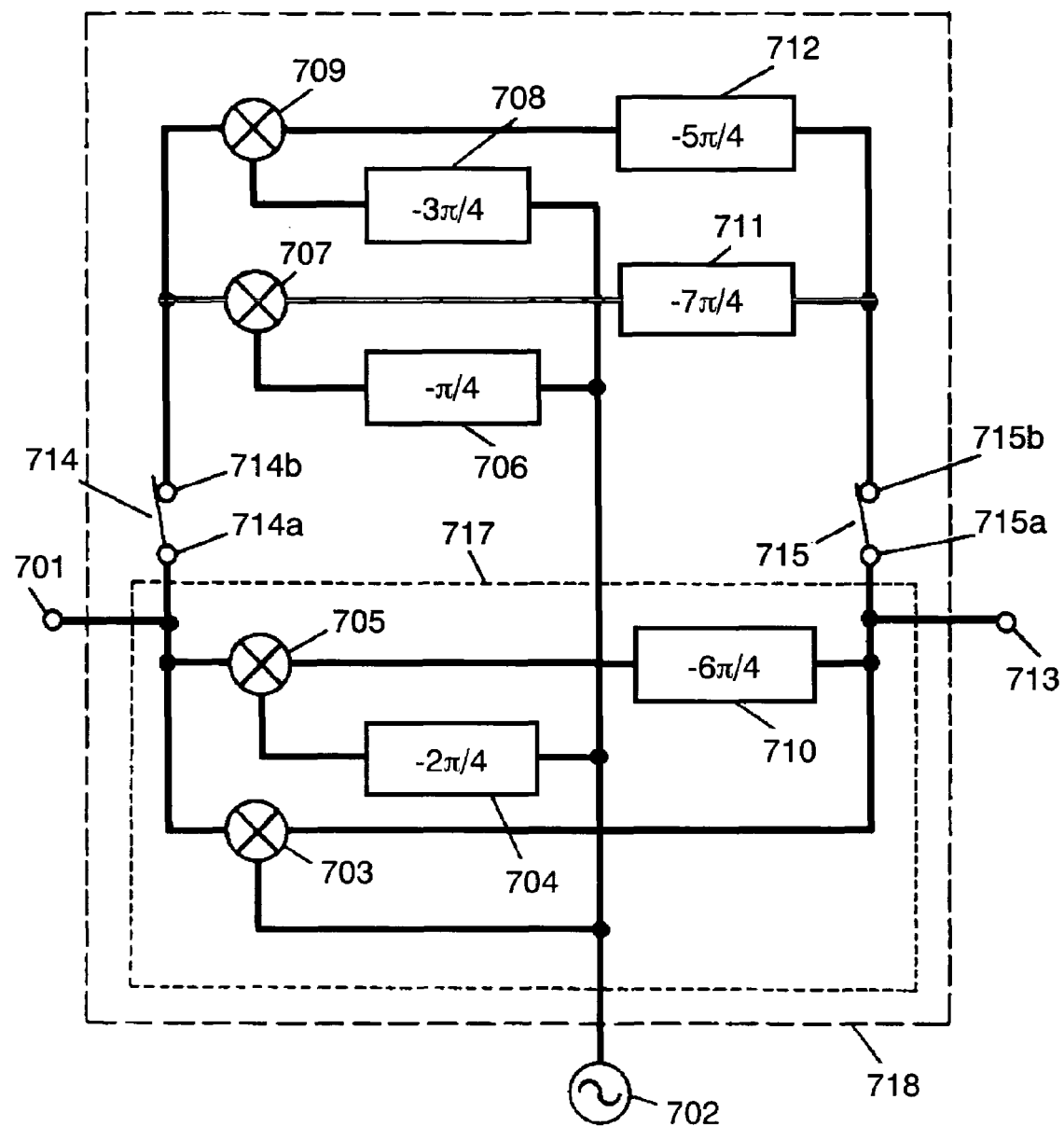
FIG. 9 is a block diagram of a mixer circuit in the exemplary embodiment 7 of the present invention.

FIG. 9 is a block diagram of a mixer circuit in the exemplary embodiment 7 of the present invention.

In FIG. 9, the mixer circuit in the exemplary embodiment 7 comprises the fourth mixer circuit 717 (hereafter called mixer circuit 717) as IRM, and the third mixer circuit 718 (hereafter called mixer circuit 718) as HRM. These mixer circuits 717 and 718 are properly switched by switching means 714, 715 provided with electronic circuits. The switching signals of the switching means 714, 715 are given externally.

First, the mixer circuit 717 as IRM is described. In FIG. 9, the input terminal 701 is connected to one input of the mixer 703. The other input of mixer 703 is directly connected to the oscillator 702. Also, the output of mixer 703 is connected to the output terminal 713.

Also, the input terminal 701 is connected to one input of the mixer 705, and also the output of oscillator 702 is connected to the other input of the mixer 705 via oscillator phase shifter 704 with phase shift of $-2\pi/4$ radian. Also, the output of mixer 705 is connected to the output terminal 713 via intermediate frequency phase shifter 710 with phase shift of $-6\pi/4$ radian.

Next, mixer circuit 718 as HRM is described. The mixer circuit 718 shares all the parts common with the mixer 717 as IRM.

The input terminal 701 is connected to the input terminal 714a of switching means 714. The terminal 714b of switching means 714 is connected to one input of the mixer 707, and also the output of oscillator 702 is connected to the other input of the mixer 707 via oscillator phase shifter 706 with phase shift of $-\pi/4$ radian. Also, the output of mixer 707 is connected to the terminal 715b of switching means 715 via intermediate frequency phase shifter 711 with phase shift of $-7\pi/4$ radian. And, the terminal 715a of switching means 715 is connected to the output terminal 713.

Also, the terminal 714b of switching means 714 is connected to one input of the mixer 709, and also the output of oscillator 702 is connected to the other input of the mixer 709 via oscillator phase shifter 708 with phase shift of $-3\pi/4$ radian. Also, the output of mixer 709 is connected to the terminal 715b of switching means 715 via intermediate frequency phase shifter 712 with phase shift of $-5\pi/4$ radian.

In a mixer circuit configured as described above, with switching means 714, 715 turned ON, the mixer circuit 718 as HRM of which M is 4 is selected. Also, with switching means 714, 715 turned OFF, the mixer circuit 717 as IRM can be selected.

By using such a configuration, when there exist interfering signals at an upper side and lower side apart by IF as against a frequency three times higher than the fundamental frequency from the oscillator 702, interfering signals at an upper side and lower side apart by IF as against a frequency five times higher than the fundamental frequency from the oscillator 702, worsening the signal receiving condition, the mixer circuit 718 as HRM of which M is 4 can be selected. Also, in case the interference is caused by only image interfering signals, the mixer circuit 717 as IRM can be selected. There are provided switching means 714, 715 which enable such selection. The mixer circuit is capable of reducing the power consumption and suited for portable equipment and the like.

Further, the phase shift amounts of oscillator phase shifters 706, 704, 708 are $-\pi/4$ radian, $2\times(-\pi/4)$ radian, and $3\times(-\pi/4)$ radian respectively. That is, since these phase shift amounts are two or three times as against the basic amount of $-\pi/4$ radian, it is easy to design the oscillator phase shifters 706, 704, 708 based upon a flip-flop system.

Thus, in the exemplary embodiment 7, when the signal receiving condition is affected by interfering signals at a lower side or upper side apart by IF as against a frequency three times or five times higher than the fundamental frequency from the oscillator, a mixer circuit as HRM of which M is 4 is operated, and in case of interference caused by only image interfering signal, IRM is operated, thereby enabling switching operation.

Accordingly, switching can be properly executed according to the signal receiving conditions, and it becomes possible to reduce the power consumption as a result. Also, it is suited for portable equipment and the like because switching can be done according to the place of signal reception.

Also, the phase shift amounts of oscillator phase shifters are $-\pi/4$ radian, $2\times(-\pi/4)$ radian, and $3\times(-\pi/4)$ radian. That is, since these phase shift amounts are two or three times as against the basic oscillator phase shifter having a phase shift amount of $-\pi/4$ radian, it is easy to design the phase shifters based on a flip-flop system which is used when high phase accuracy is required.

Exemplary Embodiment 8

Figure 10:
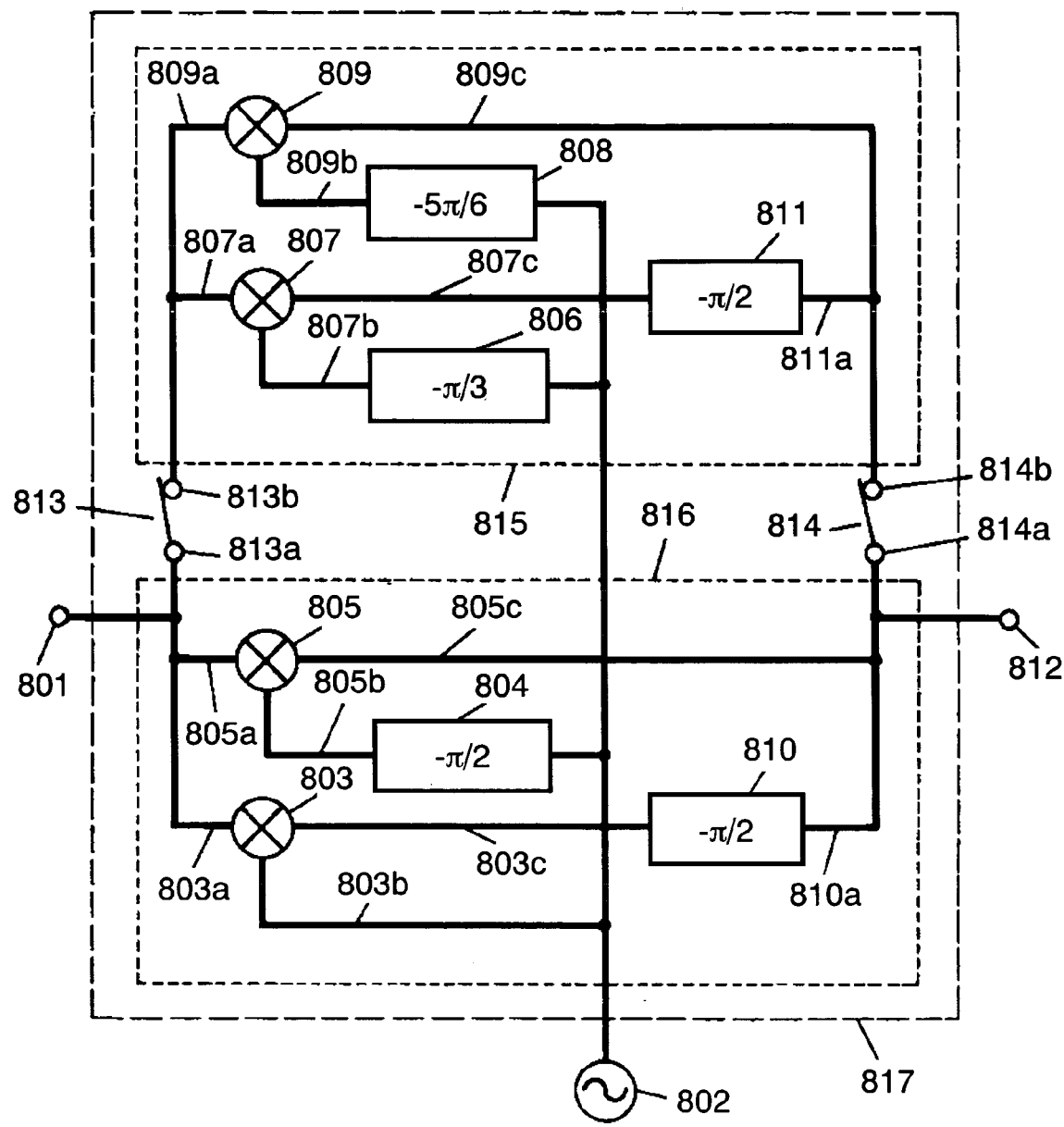
FIG. 10 is a block diagram of a mixer circuit in the exemplary embodiment 8 of the present invention.

FIG. 10 is a block diagram of a mixer circuit in the exemplary embodiment 8 of the present invention.

In FIG. 10, the mixer circuit in the exemplary embodiment 8 comprises the fourth mixer circuit 816 (hereafter called mixer circuit 816) as IRM, the fifth mixer circuit 815 (hereafter called mixer circuit 815) as HRM, and the sixth mixer circuit 817 (hereafter called mixer circuit 817). The mixer circuits 816 and 817 are properly switched by switching means 813, 814 provided with electronic circuits. The switching signals of the switching means 813, 814 are given externally.

First, the mixer circuit 816 as IRM is described. In FIG. 10, the input terminal 801 is connected to one input of the mixer 803. The other input of mixer 803 is directly connected to the oscillator 802. Also, the output of mixer 803 is connected to the output terminal 812 via intermediate frequency phase shifter 810 having phase shift of $-\pi/2$ radian.

Also, the input terminal 801 is connected to one input of the mixer 805, and also the output of oscillator 802 is connected to the other input of the mixer 805 via oscillator phase shifter 804 with phase shift of $-\pi/2$ radian. Also, the output of mixer 805 is directly connected to the output terminal 812.

Next, mixer circuit 817 as HRM is described. The mixer circuit 817 shares all the parts common with the mixer 816 and mixer circuit 815 as IRM.

The input terminal 801 is connected to the input terminal 813a of switching means 813. The terminal 813b of switching means 813 is connected to one input of the mixer 807. The output of oscillator 802 is connected to the other input of the mixer 807 via oscillator phase shifter 806 with phase shift of $-\pi/3$ radian. Also, the output of mixer 807 is connected to the terminal 814b of switching means 814 via intermediate frequency phase shifter 811 with phase shift of $-\pi/2$ radian. And, the terminal 814a of switching means 814 is connected to the output terminal 812.

Also, the terminal 813b of switching means 813 is connected to one input of the mixer 809, and also the output of oscillator 802 is connected to the other input of the mixer 809 via oscillator phase shifter 808 with phase shift of $-5\pi/6$ radian. Also, the output of mixer 809 is directly connected to the terminal 814b of switching means 814.

In a mixer circuit configured as described above, with both of switching means 813, 814 turned ON, the mixer circuit 817 as HRM is selected. Also, with both of switching means 813, 814 turned OFF, the mixer circuit 816 as IRM can be selected.

Figure 11:
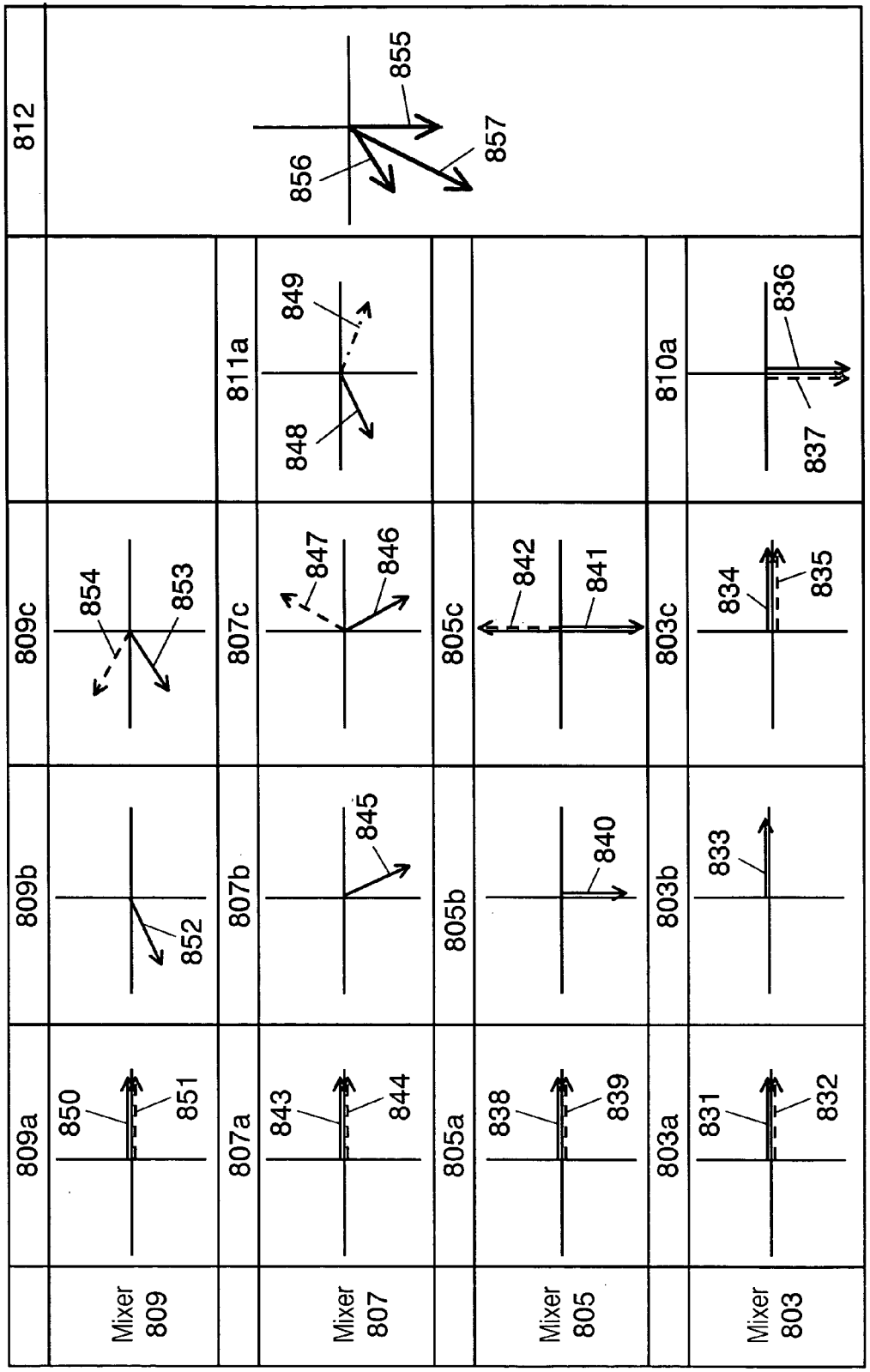
FIG. 11 is a phase chart of desired signal and image interfering signal at the mixer circuit in the exemplary embodiment 8 of the present invention.

FIG. 11 is a chart showing the phases of desired signal and image interfering signal at the mixer circuit in the exemplary embodiment 8 of the present invention. Also shown are the phases of desired signal and image interfering signal at each part of mixers 803, 805, 807, 809, and the amplitudes are not represented. The desired signal is shown by solid lines, and the image interfering signal is shown by dotted lines.

The configuration wherein desired signal is allowed to pass and image interfering signal is canceled will be described in detail with reference to FIG. 11. The phase calculating expressions are based on same conception as in the formula 16 through formula 35 shown in the exemplary embodiment 1, which will be described by using the drawing.

Firstly, the phases of both desired signal 831 and image interfering signal 832 inputted to one input 803a of the mixer 803 are 0 radian. Also, the phase of signal 833 of oscillator 802 inputted to the other input 803b of the mixer 803 can be represented as 0 radian. On the other hand, the desired signal 834 outputted from the output 803c of the mixer 803 becomes 0 radian in phase. Also, the image interfering signal 835 becomes 0 radian in phase. Further, since these signals are phase-shifted by $-\pi/2$ radian by the intermediate frequency phase shifter 810, the desired signal 836 and image interfering signal 837 of output 810a from the intermediate frequency phase shifter 810 can be represented as in FIG. 11.

Secondly, both of desired signal 838 and image interfering signal 839 inputted to one input 805a of the mixer 805 are 0 radian, same as the desired signal 831 and the image interfering signal 832 at the mixer 803. Signal 840 from the oscillator phase shifter 804 inputted to the other input 805b of the mixer 805 is phase-shifted by $-\pi/2$ radian as against the oscillator 802. Accordingly, the desired signal 841 from the output 805c of mixer 805 is phase-shifted by $-\pi/2$ radian, while the image interfering signal 842 is phase-shifted by $+\pi/2$ radian in the presentation.

Thirdly, both of desired signal 843 and image interfering signal 844 inputted to one input 807a of the mixer 807 are 0 radian in phase, same as the desired signal 831 and the image interfering signal 832 at the mixer 803. Signal 845 inputted to the other input 807b of the mixer 807 via the oscillator phase shifter 806 is phase-shifted by $-\pi/3$ radian as against the phase of oscillator 802. Also, desired signal 846 from the output 807c of the mixer 807 is phase-shifted by $-\pi/3$ radian, and image interfering signal 847 is phase-shifted by $+\pi/3$ radian. Further, since these signals are phase-shifted by $-\pi/2$ radian by the intermediate frequency phase shifter 811, the desired signal 848 and the image interfering signal 849 at output 811a from the intermediate frequency phase shifter 811 can be represented as in FIG. 11.

Fourthly, both of desired signal 850 and image interfering signal 851 inputted to one input 809a of the mixer 809 are 0 radian in phase, same as the desired signal 831 and the image interfering signal 832 at the mixer 803. Signal 852 inputted to the other input 809b of the mixer 809 via the oscillator phase shifter 808 is phase-shifted by −5π/6 radian as against the phase of oscillator 802. Also, desired signal 853 from the output 809c of the mixer 809 is phase-shifted by −5π/6 radian, and image interfering signal 854 is phase-shifted by +5π/6 radian.

Finally, the IF component of the desired signal outputted from output terminal 812 is a composite signal of desired signals 836, 841, 848, 853. The desired signals 836, 841 are identical in phase with each other, and compounded to become signal 855. The signals 848, 853 are identical in phase with each other, and compounded to become signal 856. The composite signals 855 and 856 include phase difference of π/3 from each other, and they are vector-compounded to become signal 857 to be outputted from the output terminal 812.

Also, the IF component of the image interfering signal outputted from output terminal 812 is a composite signal of image interfering signals 837, 842, 849, 854. The image interfering signals 837, 842 are signals outputted from the mixer circuit 816 as IRM, which are canceled each other because of having a phase difference of π radian. That is, these image interfering signal components are not outputted. Further, the image interfering signals 849, 854 are signals outputted from the mixer circuit 815 as IRM, which are canceled each other because of having a phase difference of π radian. That is, these image interfering signal components are not outputted either. That is, the image interfering signals are not outputted from the output terminal 812.

Figure 12:
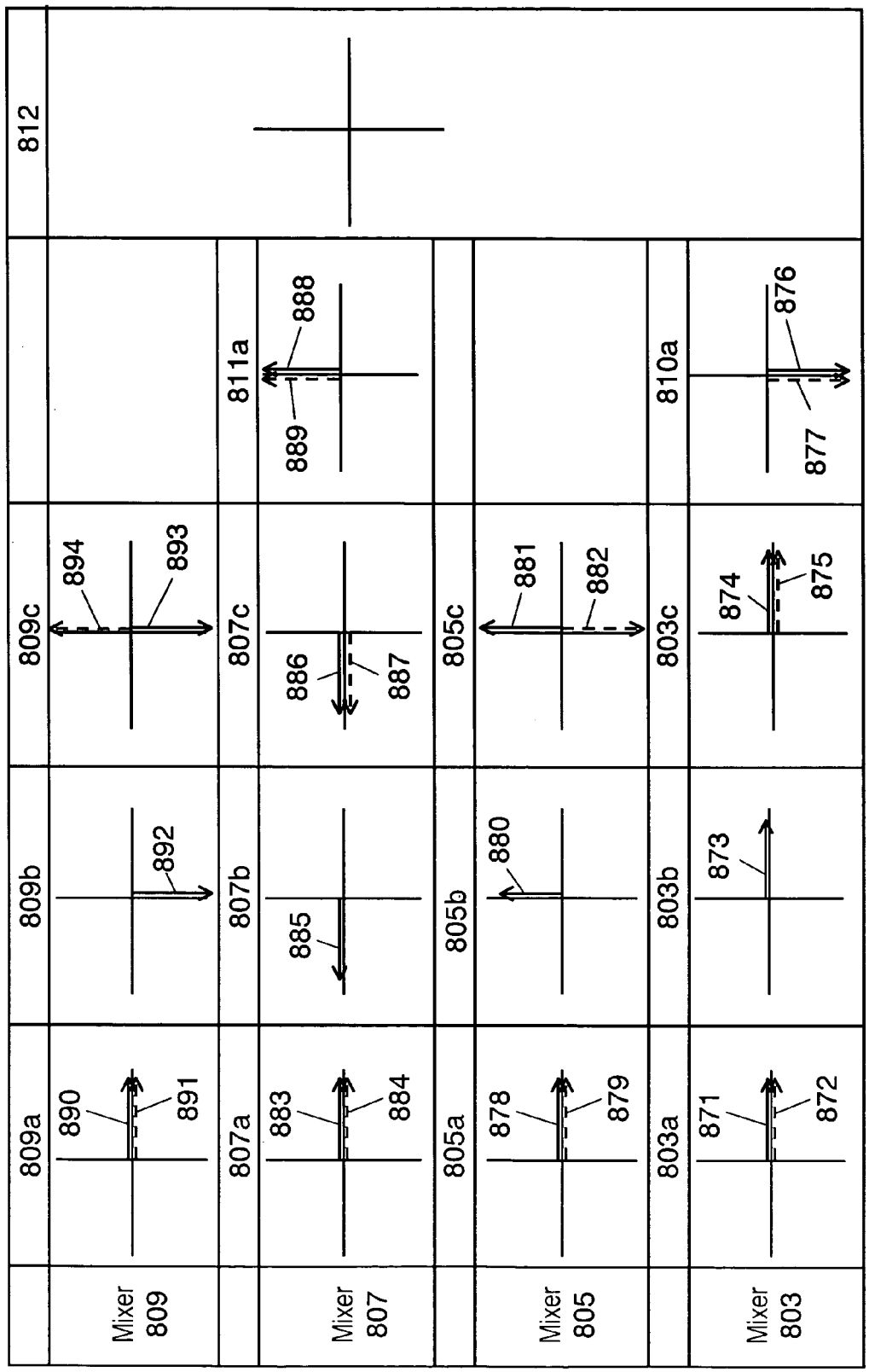
FIG. 12 is a phase chart of interfering signal related to a frequency three times higher as against the fundamental frequency of the oscillator at the mixer circuit in the exemplary embodiment 8 of the present invention.

FIG. 12 is a chart showing the phases of interfering signals related to a frequency three times higher than the fundamental frequency from oscillator 802 at the mixer circuit in the exemplary embodiment 8 of the present invention.

FIG. 12 shows the phases of interfering signals at a lower side or upper side apart by IF as against a frequency three times higher than the fundamental frequency from the oscillator 802 at each part of mixers 803, 805, 807, 809, and the amplitudes are not represented.

The configuration wherein interfering signal at a lower side or upper side apart by IF as against a frequency three times higher than the fundamental frequency of the oscillator 802 is canceled will be described in detail with reference to FIG. 12.

Firstly, both of interfering signal 871 as interfering signal Vm1 at a lower side apart by IF as against a frequency three times higher than the fundamental frequency from oscillator 802, and interfering signal 872 as interfering signal Vm2 at an upper side apart by IF as against a frequency three times higher than the fundamental frequency from the oscillator 802, which are inputted to one input 803a of mixer 803, are 0 radian in phase. Also, the phase of signal 873 of oscillator 802 inputted to the other input 803b of the mixer 803 can be represented as 0 radian. On the other hand, both of the interfering signal 874 as interfering signal Vm1 and interfering signal 875 as Vm2 outputted as IF signal components from the output 803c of the mixer 803 become 0 radian in phase.

Further, since these signals are phase-shifted by −π/2 radian by the intermediate frequency phase shifter 810, the interfering signal 876 as interfering signal Vm1 and interfering signal 877 as interfering signal Vm2 included in the IF signal components at the output 810a from the intermediate frequency phase shifter 810 can be represented as shown in FIG. 12.

Secondly, both of interfering signal 878 as interfering signal Vm1 and interfering signal 879 as interfering signal Vm2 inputted to one input 805a of the mixer 805 are 0 radian, same as the interfering signal (Vm1) 871 and the interfering signal (Vm2) 872 at the mixer 803. Signal 880 from the oscillator phase shifter 804 inputted to the other input 805b of the mixer 805 is phase-shifted by 3×(−π/2) radian as against the oscillator 802. Accordingly, the interfering signal (Vm1) 881 as IF signal component from the output 805c of mixer 805 is phase-shifted by 3×(−π/2) radian, while the interfering signal (Vm2) 882 is phase-shifted by 3×(π/2) radian in the presentation.

Thirdly, both of interfering signal 883 as interfering signal Vm1 and interfering signal 884 as interfering signal Vm2 inputted to one input 807a of the mixer 807 are 0 radian in phase, same as the interfering signal 871 (Vm1) and the interfering signal 872 (Vm2) at the mixer 803. Signal 885 inputted to the other input 807b of the mixer 807 via the oscillator phase shifter 806 is phase-shifted by 3×(−π/3) radian as against the phase of oscillator 802. Also, interfering signal (Vm1) 886 as IF signal component from the output 807c of the mixer 807 is phase-shifted by 3×(−π/3) radian, and interfering signal (Vm2) 887 is phase-shifted by 3×(−π/3) radian. Further, since these signals are phase-shifted by −π/2 radian by the intermediate frequency phase shifter 811, the interfering signal (Vm1) 888 and interfering signal (Vm2) 889 as IF signal components of output 811a from the intermediate frequency phase shifter 811 can be represented as shown in FIG. 12.

Fourthly, both of interfering signal 890 as interfering signal Vm1 and interfering signal 891 as interfering signal Vm2 inputted to one input 809a of the mixer 809 are 0 radian in phase, same as the interfering signal (Vm1) 871 and the interfering signal (Vm2) 872 at the mixer 803. Signal 892 inputted to the other input 809b of the mixer 809 via the oscillator phase shifter 808 is phase-shifted by 3×(−5π/6) radian as against the phase of oscillator 802.

Accordingly, interfering signal 893 (Vm1) in the IF signal component from the output 809c of the mixer 809 is phase-shifted by 3×(−5π/6) radian, and interfering signal (Vm2) 894 is phase-shifted by 3×(5π/6) radian.

Finally, the IF component of the interfering signal Vm1 outputted from output terminal 812 is a composite signal of interfering signal 876, interfering signal 881, interfering signal 888, and interfering signal 893. The interfering signal 876 and interfering signal 881 are canceled each other because of having a phase difference of π radian. Also, the interfering signal 888 and interfering signal 893 are also canceled each other because of having a phase difference of π radian.

Also, the IF component of the interfering signal Vm2 outputted from output terminal 812 is a composite signal of interfering signal 877, interfering signal 882, interfering signal 889, and interfering signal 894. The interfering signal 877 and interfering signal 889 are canceled each other because of having a phase difference of π radian. Also, interfering signal 882 and interfering signal 894 are also canceled each other because of having a phase difference of π radian. That is, the IF signal component of interfering signal Vm2 is not outputted from the output terminal 812.

By using such a configuration, when there exist interfering signals at an upper side and lower side apart by IF as against a frequency three times higher than the fundamental frequency from the oscillator 802, interfering signals at an upper side and lower side apart by IF as against a frequency five times higher than the fundamental frequency from the oscillator 802, worsening the signal receiving condition, the mixer circuit 817 as HRM can be selected. Also, when only image interfering signal exists as interfering signal, the mixer circuit 816 as IRM can be selected. The configuration shown in FIG. 10 enables such switching. Accordingly, it is possible to reduce the power consumption by properly switching the switching means 813 and switching means 814, and the configuration is suited for portable equipment and the like.

The mixer circuit 817 as HRM comprises the mixer circuit 816 as IRM and mixer circuit 815 as IRM. There are provided oscillator phase shifters 806, 808 by which the difference in phase shift from oscillator 802 inputted to the other inputs of mixer 807 and mixer 809 in the mixer circuit 815 as against the phase shift amount from oscillator 802 inputted to the other inputs of mixer 803 and mixer 805 in the mixer circuit 816 are respectively given $-\pi/3$ radian of phase difference. Accordingly, in the exemplary embodiment 8 using HRM of which M is 4, three intermediate frequency phase shifters of different phase shift amounts are required, but used are two intermediate frequency phase shifters same in phase shift amount as in the exemplary embodiment 1. That is, the number of parts can be reduced and the phase difference at the intermediate frequency phase shifters 810, 811 can be lessened and it is possible to enhance the degree of suppression of interfering signals related to higher harmonic component generated due to the fundamental output component of the oscillator 802.

Accordingly, in a receiver or the like using a mixer circuit shown in the exemplary embodiment 8, switching can be properly executed according to the signal receiving condition and it is suited for portable equipment and the like because the consumption of power can be reduced.

Also, the intermediate frequency phase shifters of the fourth mixer circuit and the fifth mixer circuit, both of which are $-\pi/2$ radian in phase shift, can be used, and it is possible to suppress the variations and to enhance the degree of suppression against interference.

Exemplary Embodiment 9

Figure 13:
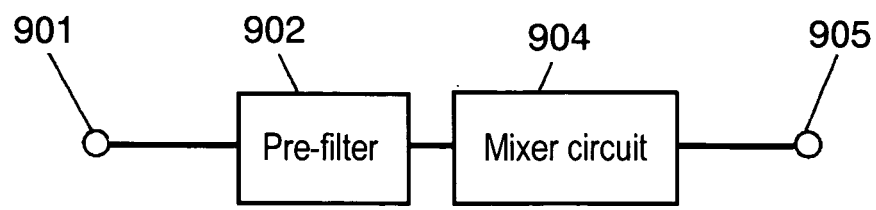
FIG. 13 is a block diagram of a mixer circuit and a high-frequency receiver in the exemplary embodiment 9 of the present invention.

FIG. 13 is a block diagram of a mixer circuit and a high-frequency receiver in the exemplary embodiment 9 of the present invention.

In FIG. 13, the high-frequency receiver of the present exemplary embodiment is configured in that the high-frequency signal inputted to input terminal 901 is inputted to the mixer circuit 904 after signal other than the desired signal is attenuated by pre-filter 902. Also, the output of mixer circuit 904 is connected to the output terminal 905 from which IF signal is outputted. Here, as the mixer circuit 904, those in the exemplary embodiment 1 through exemplary embodiment 8 of the present invention are employed.

When the mixer circuit 904 is HRM of which the number of mixers M is 3, it is possible to suppress image interfering signals, interfering signals at an upper side and lower side apart by IF as against a frequency three times higher than the fundamental frequency from the oscillator in the mixer circuit 904, and interfering signals at a lower side apart by IF as against a frequency five times higher than the fundamental frequency from the oscillator 802. Accordingly, the attenuation characteristics of the pre-filter 902 can be relieved, and it is possible to reduce the size and to lower the cost.

Incidentally, the mixer circuit 904 in the high-frequency receiver of the present exemplary embodiment is not limited to HRM of which the number of mixers M is 3. It is preferable to use any mixer circuits of the present invention shown in the exemplary embodiment 1 through exemplary embodiment 8.

Also, in the exemplary embodiment 9, it is possible to employ the mixer circuits mentioned in the exemplary embodiment 3 as mixer circuit 904. In this way, it is possible to cancel interference related to interfering signals at a lower side or upper side apart by IF as against a frequency 3 times to 2M–3 times higher than the fundamental frequency from the oscillator where M is 3 or over. The attenuation characteristics of the pre-filter can be so much relieved over a wide range of frequency, and it is possible to further reduce the size and to lower the cost.

Exemplary Embodiment 10

Figure 14:
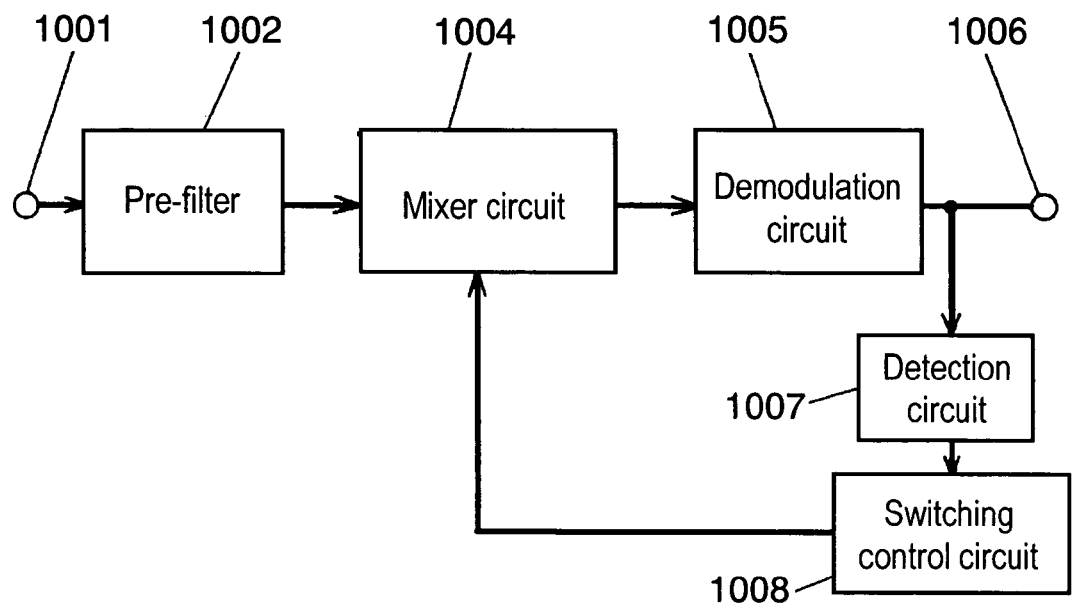
FIG. 14 is a block diagram of a mixer circuit and a high-frequency receiver in the exemplary embodiment 10 of the present invention.

FIG. 14 is a block diagram of a mixer circuit and a high-frequency receiver in the exemplary embodiment 10 of the present invention.

In FIG. 14, the high-frequency receiver of the present exemplary embodiment is configured in that the high-frequency signal inputted to input terminal 1001 is inputted to the mixer circuit 1004 after signal other than the desired signal is attenuated by pre-filter 1002. Also, the output of mixer circuit 1004 is connected to demodulation circuit 1005. The output of the demodulation circuit 1005 is connected to the output terminal 1006. And, demodulated signal is outputted from the output terminal 1006. Further, detection circuit 1007 for detecting signal quality is connected to the output of the demodulation circuit 1005, and switching control circuit 1008 receiving the signal from the detection circuit 1007 functions to control the switching means in the mixer circuit 1004 with the output signal.

That is, when the detection circuit 1007 detects that the signal reception is not in good condition, the switching means in the mixer circuit 1004 is switched by the switching control circuit 1008 from IRM being low in power consumption to HRM being excellent in interference performance, thereby improving the signal receiving condition. Thus, an optimum circuit can be selected according to the signal receiving condition. The mixer circuit 1004 used are those shown in the exemplary embodiment 6 through exemplary embodiment 8.

In the exemplary embodiment 10, it is possible to employ the mixer circuits mentioned in the exemplary embodiment 6 as the mixer circuit 1004. In this way, when it is detected by the detection circuit 1007 that the signal reception is in bad condition, the switching means of the mixer is switched by the switching control circuit 1008 from IRM being low in power consumption to HRM being excellent in interference performance, thereby improving the signal receiving condition. As a result, an optimum circuit can be selected according to the signal receiving condition.

Also, in the exemplary embodiment 10, it is possible to employ the mixer circuits mentioned in the exemplary embodiment 7 as the mixer circuit 1004. In this way, when it is detected by the detection circuit that the signal reception is in bad condition, the switching means in the mixer is switched by the switching control circuit from IRM being low in power consumption to HRM of M=4 being excellent in interference performance, thereby improving the signal receiving condition. As a result, an optimum circuit can be selected according to the signal receiving condition.

Also, in the exemplary embodiment 10, it is possible to employ the mixer circuits mentioned in the exemplary embodiment 8 as the mixer circuit 1004. In this way, when it is detected by the detection circuit that the signal reception is in bad condition, the switching means of the mixer is switched by the switching control circuit from IRM being low in power consumption to HRM of M=4 being excellent in interference performance, thereby improving the signal receiving condition. As a result, an optimum circuit can be selected according to the signal receiving condition.

As described above, according to the present invention, it is possible to provide a mixer circuit which can suppress image interfering signal, interfering signal being at an upper side or lower side apart by IF as against higher harmonic frequency of the oscillator. Accordingly, the mixer circuit of the present invention is able to sufficiently suppress interference that is a substantial problem in receiving high-frequency signals. And, when the mixer circuit of the present invention is used in a high-frequency receiver, it is able to maintain good signal receiving condition.

Further, since the mixer circuit of the present invention is able to suppress interfering signals being at an upper side or lower side apart by IF as against higher harmonic frequency of the oscillator, the attenuation characteristics can be relieved by the pre-filter connected to the input of the mixer. Accordingly, it is possible to reduce the size and to lower the cost by using the mixer circuit of the present invention in a high-frequency receiver.

What is claimed is:

1. A mixer circuit, comprising:
   an oscillator;
   a first mixer of which high-frequency signal is supplied to one input, and output signal of the oscillator is supplied to the other input;
   an output terminal to which output from the first mixer is supplied;
   a second mixer of which the high-frequency signal is supplied to one input thereof;
   a first oscillator phase shifter which is connected between the other input of the second mixer and the output of the oscillator and serves to shift the phase of output signal of the oscillator by $-\pi/3$ radian as against the phase of the other input of the first mixer;
   a first intermediate frequency phase shifter which is connected between the output of the second mixer and the output terminal and serves to shift the phase of output of the second mixer by $-5\pi/3$ radian;
   a third mixer of which the high-frequency signal is supplied to one input thereof;
   a second oscillator phase shifter which is connected between the other input of the third mixer and the output of the oscillator and serves to shift the phase of output signal of the oscillator by $-2\pi/3$ radian as against the phase of the other input of the first mixer; and
   a second intermediate frequency phase shifter which is connected between the output of the third mixer and the output terminal and serves to shift the phase of output of the third mixer by $-4\pi/3$ radian,
   wherein each of the other input of the first mixer, the other input of the second mixer, and the other input of the third mixer is provided with a limiter circuit.

2. The mixer circuit of claim 1, further comprising a filter which is inserted in the output of the oscillator and allows the fundamental output component of the oscillator to pass.

3. The mixer circuit of claim 1,
   wherein the first oscillator phase shifter and the second oscillator phase shifter are based on a flip-flop system; and
   wherein the first intermediate frequency phase shifter and the second intermediate frequency phase shifter are based on a poly-phase filter system.

4. The mixer circuit of claim 1, wherein the first oscillator phase shifter, the second oscillator phase shifter, the first intermediate frequency phase shifter, and the second intermediate frequency phase shifter are based on a poly-phase filter system.

5. The mixer circuit of claim 1, wherein the first oscillator phase shifter, the second oscillator phase shifter, the first intermediate frequency phase shifter, and the second intermediate frequency phase shifter are based on a flip-flop system.

6. A mixer circuit, comprising:
   an oscillator;
   M (M is a natural number 3 or over) pieces mixers of which high-frequency signal is supplied to one respective inputs, and output signal of the oscillator is supplied to the other respective inputs;
   an output terminal to which the outputs of the respective mixers are supplied;
   K-th (K is a natural number ranging from 1 to M with 1 added each) oscillator phase shifter which is connected between the other input of K-th (K is a natural number ranging from 1 to M with 1 added each) mixer out of the M pieces of the mixers and the oscillator and serves to shift the output signal of the oscillator by $-K\pi/M$ radian; and
   K-th (K is a natural number ranging from 1 to M with 1 added each) intermediate frequency phase shifter which is connected between the output of the K-th mixer and the output terminal and serves to shift the output of the K-th mixer by $-2\pi+K\,\pi/M$ radian,
   wherein each of the other inputs of the respective mixers is provided with a limiter circuit.

7. The mixer circuit of claim 6, further comprising a filter which is inserted in the output of the oscillator and allows the fundamental output component of the oscillator to pass.

8. The mixer circuit of claim 6, wherein the other input of the M-th mixer is directly connected to the output of the oscillator, and the output of the M-th mixer is directly connected to the output terminal.

9. A mixer circuit, comprising:
   an oscillator;
   a first mixer of which high-frequency signal is supplied to one input, and output signal of the oscillator is supplied to the other input;
   an output terminal to which output from the first mixer is supplied;
   a second mixer of which the high-frequency signal is supplied to one input thereof;
   a first oscillator phase shifter which is connected between the other input of the second mixer and the output of the oscillator and serves to shift the phase of output signal of the oscillator by $-\pi/3$ radian as against the phase of the other input of the first mixer;
   a first intermediate frequency phase shifter which is connected between the output of the second mixer and the output terminal and serves to shift the phase of output of the second mixer by $-5\pi/3$ radian;
   a third mixer of which the high-frequency signal is supplied to one input thereof;
   a second oscillator phase shifter which is connected between the other input of the third mixer and the output signal of the oscillator and serves to shift the phase of output signal of the oscillator by −2π/3 radian as against the phase of the other input of the first mixer; and a second intermediate frequency phase shifter which is connected between the output of the third mixer and the output terminal and serves to shift the phase of output of the third mixer by −4π/3 radian, wherein there are provided a first mixer circuit of which each of the other input of the first mixer, the other input of the second mixer, and the other input of the third mixer is provided with a limiter circuit;

a second mixer circuit which forms an image rejection mixer, using the first mixer and the oscillator; and a switching means which is capable of switching the first mixer circuit and the second mixer circuit by signals from a switching control circuit.

10. A mixer circuit, comprising:

a third mixer circuit comprising:

an oscillator;

M (M is a natural number 3 or over) pieces of mixers of which high-frequency signal is supplied to one respective inputs, and output signal of the oscillator is supplied to the other respective inputs;

an output terminal to which the outputs of the respective mixers are supplied;

K-th (K is a natural number ranging from 1 to M with 1 added each) oscillator phase shifter which is connected between the other input of K-th (K is a natural number ranging from 1 to M with 1 added each) mixer out of the M pieces of the mixers and the oscillator and serves to shift the output signal of the oscillator by −Kπ/M radian; and K-th (K is a natural number ranging from 1 to M with 1 added each) intermediate frequency phase shifter which is connected between the output of the K-th mixer and the output terminal and serves to shift the output of the K-th mixer by −2π+K π/M radian, wherein each of the other inputs of the respective mixers is provided with a limiter circuit;

wherein the other input of the M-th mixer is directly connected to the output of the oscillator, and the output of the M-th mixer is directly connected to the output terminal; and wherein the value of M is 4;

an image rejection mixer, using parts in the third mixer circuit; and a switching means which is capable of switching the third mixer circuit and the image rejection mixer by signals from a switching control circuit.

11. A mixer circuit, comprising:

a fourth mixer circuit formed of an image rejection mixer;

a fifth mixer circuit formed of an image rejection mixer;

an oscillator commonly used by at least the fourth mixer circuit and the fifth mixer circuit;

an oscillator phase shifter which supplies signals, phase-shifted by −π/3 radian as against signals inputted from the oscillator to the fourth mixer circuit, to the fifth mixer circuit;

a sixth mixer circuit with the fourth mixer circuit and the fifth mixer circuit connected in parallel fashion; and a switching means which is capable of switching the fourth mixer circuit and the sixth mixer circuit by signals from a switching control circuit.

12. The mixer circuit of claim 6, wherein at least the mixer and the oscillator phase shifter are integrated in same package.

13. The mixer circuit of claim 6, wherein at least the mixer, the oscillator phase shifter, and the intermediate frequency phase shifter are integrated in same package.

14. A high-frequency signal receiver, comprising:

a pre-filter to which high frequency signal is supplied;

a mixer circuit comprising:

an oscillator;

a first mixer of which output of the pre-filter is supplied to one input, and output signal of the oscillator is supplied to the other input;

an output terminal to which output from the first mixer is supplied;

a second mixer of which output of the pre-filter is supplied to one input thereof;

a first oscillator phase shifter which is connected between the other input of the second mixer and the output of the oscillator and serves to shift the phase of output signal of the oscillator by −π/3 radian as against the phase of the other input of the first mixer;

a first intermediate frequency phase shifter which is connected between the output of the second mixer and the output terminal and serves to shift the phase of output of the second mixer by −5π/3 radian;

a third mixer of which output of the pre-filter is supplied to one input thereof;

a second oscillator phase shifter which is connected between the other input of the third mixer and the output signal of the oscillator and serves to shift the phase of output signal of the oscillator by −2π/3 radian as against the phase of the other input of the first mixer; and a second intermediate frequency phase shifter which is connected between the output of the third mixer and the output terminal and serves to shift the phase of output of the third mixer by −4π/3 radian, wherein there are provided a mixer circuit in which each of the other input of the first mixer, the other input of the second mixer, and the other input of the third mixer is provided with a limiter circuit; and an output terminal to which output signal of the mixer circuit is supplied, wherein the pre-filter is relieved in attenuation characteristics at frequencies that become image interfering signals and interfering signals being at a lower side or upper side apart by intermediate frequency as against a frequency three times higher than the fundamental frequency of the oscillator in the mixer circuit.

15. A high-frequency signal receiver, comprising:

a pre-filter to which high-frequency signal is supplied;

a mixer circuit comprising:

an oscillator;

M (M is a natural number 3 or over) pieces of mixers of which the output of the pre-filter is supplied to one respective inputs, and the output signal of the oscillator is supplied to the other respective inputs;

an output terminal to which the outputs of the respective mixers are supplied;

K-th (K is a natural number ranging from 1 to M with 1 added each) oscillator phase shifter which is connected between the other input of K-th (K is a natural number ranging from 1 to M with 1 added each) mixer out of the M pieces of the mixers and the oscillator and serves to shift the output signal of the oscillator by −Kπ/M radian; and K-th (K is a natural number ranging from 1 to M with 1 added each) intermediate frequency phase shifter which is connected between the output of the K-th mixer and the output terminal and serves to shift the output of the K-th mixer by $-2\pi+K\ \pi/M$ radian,
wherein there are provided the mixer circuit in which each of the other inputs of the respective mixers is provided with a limiter circuit; and
an output terminal to which output signal of the mixer circuit is supplied,
wherein the pre-filter is relieved in attenuation characteristics at frequencies that become image interfering signals and interfering signals being at a lower side or upper side apart by intermediate frequency as against a frequency three times higher than the fundamental frequency of the oscillator.

16. A high-frequency signal receiver, comprising:
a pre-filter to which high frequency signal is supplied;
a mixer circuit comprising:
   a first mixer circuit comprising:
      an oscillator;
      a first mixer of which output of the pre-filter is supplied to one input, and output signal of the oscillator is supplied to the other input;
      an output terminal to which output from the first mixer is supplied;
      a second mixer of which output of the pre-filter is supplied to one input thereof;
      a first oscillator phase shifter which is connected between the other input of the second mixer and the output of the oscillator and serves to shift the phase of output signal of the oscillator by $-\pi/3$ radian as against the phase of the other input of the first mixer;
      a first intermediate frequency phase shifter which is connected between the output of the second mixer and the output terminal and serves to shift the phase of output of the second mixer by $-5\pi/3$ radian;
      a third mixer of which output of the pre-filter is supplied to one input thereof;
      a second oscillator phase shifter which is connected between the other input of the third mixer and the output signal of the oscillator and serves to shift the phase of output signal of the oscillator by $-2\pi/3$ radian as against the phase of the other input of the first mixer; and
      a second intermediate frequency phase shifter which is connected between the output of the third mixer and the output terminal and serves to shift the phase of output of the third mixer by $-4\pi/3$ radian,
      wherein each of the other input of the first mixer, the other input of the second mixer, and the other input of the third mixer is provided with a limiter circuit;
   a second mixer circuit which forms an image rejection mixer, using the first mixer and the oscillator; and
   a switching means which is capable of switching the first mixer circuit and the second mixer circuit by signals from a switching control circuit;
a demodulation circuit to which output signal from the mixer circuit is supplied;
an output terminal to which output signal from the demodulation circuit is supplied;
a detection circuit which is supplied with output signal from the demodulation circuit and detects signal quality of the high-frequency signal; and a switching control circuit which is inserted between the output of the detection circuit and a switching means in the mixer circuit and serves to operate the switching means in accordance with output of the detection circuit.

17. A high-frequency signal receiver, comprising:
a pre-filter to which high-frequency signal is inputted;
a mixer circuit comprising:
   a third mixer circuit comprising:
      an oscillator;
      M (M is a natural number 3 or over) pieces of mixers of which output of the pre-filter is supplied to one respective inputs, and output signal of the oscillator is supplied to the other respective inputs;
      an output terminal to which outputs of the respective mixers are supplied;
      K-th (K is a natural number ranging from 1 to M with 1 added each) oscillator phase shifter which is connected between the other input of K-th (K is a natural number ranging from 1 to M with 1 added each) mixer out of the M pieces of mixers and the oscillator and serves to shift the output signal of the oscillator by $-K\pi/M$ radian; and
      K-th (K is a natural number ranging from 1 to M with 1 added each) intermediate frequency phase shifter which is connected between the output of the K-th mixer and the output terminal and serves to shift the output of the K-th mixer by $-2\pi+K\ \pi/M$ radian,
      wherein each of the other inputs of the respective mixers is provided with a limiter circuit;
      wherein the other input of the M-th mixer is directly connected to the output of the oscillator, and the output of the M-th mixer is directly connected to the output terminal; and
      wherein the value of M is 4;
   an image rejection mixer using parts in the third mixer circuit; and
   a switching means which is capable of switching the third mixer circuit and the image rejection mixer by signals from a switching control circuit;
a demodulation circuit to which output signal from the mixer circuit is inputted;
an output terminal to which output signal of the demodulation circuit is supplied;
a detection circuit which is supplied with output signal from the demodulation circuit and detects signal quality of the high-frequency signal; and
a switching control circuit which is inserted between the output of the detection circuit and a switching means in the mixer circuit and serves to operate the switching means in accordance with output of the detection circuit.

18. A high-frequency signal receiver, comprising:
a pre-filter to which high-frequency signal is inputted;
a mixer circuit comprising:
   a fourth mixer circuit formed of an image rejection mixer;
   a fifth mixer circuit formed of an image rejection mixer;
   an oscillator shared by at least the fourth mixer circuit and the fifth mixer circuit;
   an oscillator phase shifter which serves to supply signals, phase-shifted by $-\pi/3$ radian each with respect to signals inputted from the oscillator to the fourth mixer circuit, to the fifth mixer circuit;

a sixth mixer circuit formed with the fourth mixer circuit and the fifth mixer circuit connected in parallel fashion; and a switching means capable of switching the fourth mixer circuit and the sixth mixer circuit by signals from a switching control circuit, wherein output signal of the pre-filter is inputted to the mixer circuit;

a demodulation circuit to which output signal from the mixer circuit is inputted;

an output terminal to which output signal from the demodulation circuit is supplied;

a detection circuit which is supplied with output signal from the demodulation circuit and detects signal quality of the high-frequency signal; and a switching control circuit which is inserted between the output of the detection circuit and a switching means in the mixer circuit and serves to operate the switching means in accordance with output of the detection circuit.

* * * * *